US011469242B2

(12) United States Patent
Lee

(10) Patent No.: US 11,469,242 B2
(45) Date of Patent: Oct. 11, 2022

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventor: Nam Jae Lee, Cheongju-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/787,370

(22) Filed: Feb. 11, 2020

(65) Prior Publication Data

US 2021/0036002 A1 Feb. 4, 2021

(30) Foreign Application Priority Data

Aug. 2, 2019 (KR) ........................ 10-2019-0094305

(51) Int. Cl.

*H01L 27/11573* (2017.01)
*H01L 27/11582* (2017.01)
*H01L 27/11556* (2017.01)
*H01L 27/11529* (2017.01)

(52) U.S. Cl.

CPC .. *H01L 27/11573* (2013.01); *H01L 27/11529* (2013.01); *H01L 27/11556* (2013.01); *H01L 27/11582* (2013.01)

(58) Field of Classification Search

None

See application file for complete search history.

(56) References Cited

U.S. PATENT DOCUMENTS

| | | | | |
|---|---|---|---|---|
| 9,070,446 B1 * | 6/2015 | Aritome | H01L 27/11524 |
| 10,026,750 B1 * | 7/2018 | Lai | G11C 16/10 |
| 10,347,654 B1 * | 7/2019 | Iwai | H01L 27/11519 |
| 10,629,616 B1 * | 4/2020 | Kai | H01L 27/11565 |
| 2015/0055413 A1 * | 2/2015 | Alsmeier | H01L 27/11582 365/185.08 |
| 2019/0312035 A1 * | 10/2019 | Takuma | H01L 27/11575 |
| 2020/0258817 A1 * | 8/2020 | Oki | H01L 25/0657 |
| 2020/0258904 A1 * | 8/2020 | Kai | H01L 24/92 |

(Continued)

FOREIGN PATENT DOCUMENTS

| | | |
|---|---|---|
| CN | 107658315 A | 2/2018 |
| CN | 107887395 A | 4/2018 |
| KR | 1020180053918 A | 5/2018 |

*Primary Examiner* — Grant S Withers

(74) *Attorney, Agent, or Firm* — William Park & Associates Ltd.

(57) ABSTRACT

There is provided a semiconductor memory device including: a substrate having a Complementary Metal Oxide Semiconductor (CMOS) circuit; a gate stack structure including interlayer insulating layers and conductive patterns, which are alternately stacked in a vertical direction on the substrate; a channel structure having a first part penetrating the gate stack structure and a second part extending from one end of the first part, the second part extending beyond the gate stack structure; a common source line extending to overlap with the gate stack structure, the common source line surrounding the second part of the channel structure; a memory layer disposed between the first part of the channel structure and the gate stack structure; and a bit line connected to the other end of the first part of the channel structure, the bit line being disposed between the substrate and the gate stack structure.

18 Claims, 25 Drawing Sheets

(56) References Cited

U.S. PATENT DOCUMENTS

| | | | | |
|---|---|---|---|---|
| 2020/0286875 | A1* | 9/2020 | Nishida | H01L 27/11575 |
| 2020/0286905 | A1* | 9/2020 | Kai | H01L 23/5384 |
| 2020/0295043 | A1* | 9/2020 | Nishida | H01L 27/11582 |
| 2020/0395328 | A1* | 12/2020 | Fastow | H01L 24/32 |

* cited by examiner

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2019-0094305, filed on Aug. 2, 2019, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device may include a memory cell array including a plurality of memory cells. In order to improve the degree of integration of the semiconductor memory device, the memory cells may be three-dimensionally arranged. Three-dimensional semiconductor memory devices including three-dimensionally arranged memory cells may have a complicated manufacturing process due to various causes, as compared with two-dimensional semiconductor memory devices.

SUMMARY

In accordance with an aspect of the present disclosure, there is provided a semiconductor memory device including: a substrate having a Complementary Metal Oxide Semiconductor (CMOS) circuit; a gate stack structure including interlayer insulating layers and conductive patterns, which are alternately stacked in a vertical direction on the substrate; a channel structure having a first part penetrating the gate stack structure and a second part extending from one end of the first part, the second part extending beyond the gate stack structure; a common source line extending to overlap with the gate stack structure, the common source line surrounding the second part of the channel structure; a memory layer disposed between the first part of the channel structure and the gate stack structure; and a bit line connected to the other end of the first part of the channel structure, the bit line being disposed between the substrate and the gate stack structure.

In accordance with another aspect of the present disclosure, there is provided a method of manufacturing a semiconductor memory device, the method including: forming a memory cell array on a first substrate, wherein the memory cell array includes a gate stack structure including interlayer insulating layers and conductive patterns, which are alternately stacked in a vertical direction, a channel structure penetrating the gate stack structure, the channel structure having an end portion extending to the inside of the first substrate, and a memory layer extending between the end portion of the channel structure and the first substrate from between the channel structure and the gate stack structure; forming a bit line connected to the memory cell array; removing the first substrate such that the memory layer is exposed; removing a portion of the memory layer such that the end portion of the channel structure is exposed; and forming a common source line surrounding the end portion of the channel structure, the common source line extending to overlap with the gate stack structure.

DETAILED DESCRIPTION

Figure 1:
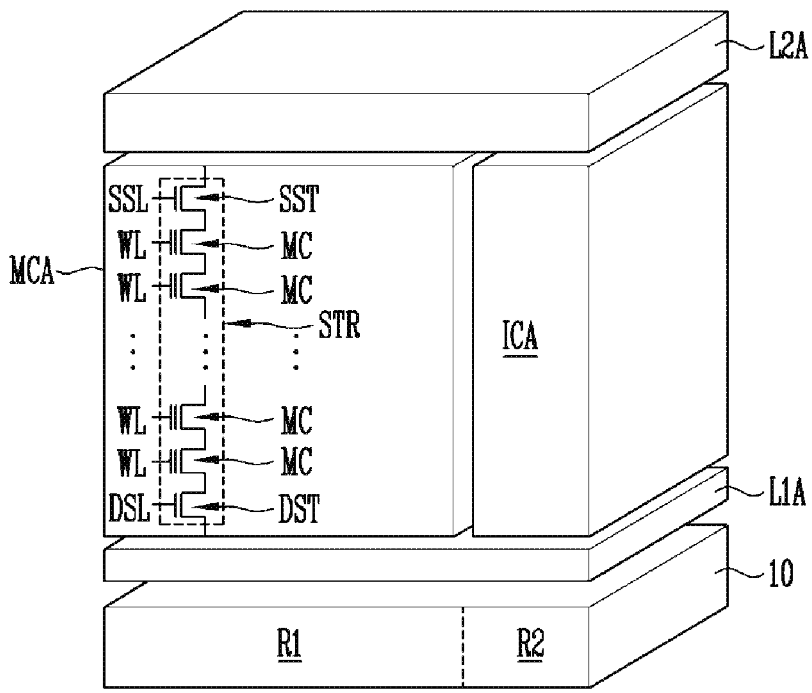
FIG. 1 is a view illustrating a semiconductor memory device in accordance with an embodiment of the present disclosure.

The structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, various examples of embodiments will be described below with reference to the accompanying drawings. Various examples of the embodiments are described herein with reference to cross-sectional illustrations that are schematic illustrations of the various examples of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being “on” another layer or substrate, it can be directly on the other or substrate, or intervening layers may also be present. It is also understood that when a structure is referred to as being "on" another structure or substrate, it can be directly on the other or substrate, or intervening structures may also be present. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to," "in direct contact with" or "directly coupled to" another element or layer, there are no intervening elements or layers present.

Embodiments provide a semiconductor memory device capable of simplifying a manufacturing process and a manufacturing method of the semiconductor memory device.

FIG. 1 is a view illustrating a semiconductor memory device in accordance with an embodiment of the present disclosure.

Referring to FIG. 1, the semiconductor memory device may include a substrate 10, a first line array L1A, a memory cell array MCA, an interconnection array ICA, and a second line array L2A.

The substrate 10 may include a first region R1 overlapping with the memory cell array MCA and a second region R2 overlapping with the interconnection array ICA.

The first line array L1A may overlap with the substrate 10, and be spaced apart from the substrate 10 in a vertical direction. The first line array L1A may include a plurality of first lines that are disposed at levels equal to each other and are made of the same conductive material. The first lines may include a plurality of bit lines connected to the memory cell array MCA and a plurality of connection lines connected to the interconnection array ICA.

The memory cell array MCA and the interconnection array ICA may be disposed on the first line array L1A.

The memory cell array MCA may include a plurality of memory cell strings STR connected to the bit lines of the first line array L1A. Each of the memory cell strings STR may include a plurality of memory cells MC connected in series between a drain select transistor DST and a source select transistor SST. Each of the memory cell strings STR may be connected a drain select line DSL, a source select line SSL, and word lines WL, which correspond thereto. The drain select line DSL may be used as a gate of the drain select transistor DST, the source select line SSL may be used as a gate of the source select transistor SST, and each of the word lines WL may be used as a gate of a memory cell MC corresponding thereto.

The interconnection array ICA may include a plurality of vertical contact plugs extending in parallel to the memory cell strings STR. Each of the vertical contact plugs may be formed of a conductive material, and be connected to a connection line corresponding thereto among the connection lines of the first line array L1A.

The second line array L2A may overlap with the memory cell array MCA and the interconnection array ICA. The second line array L2A may include a common source line. The common source line may be connected to the memory cell array MCA. The common source line may be connected to at least one of the vertical contact plugs of the interconnection array ICA. The common source line may be formed in various structures such as a mesh type structure and a line type structure.

Figure 2:
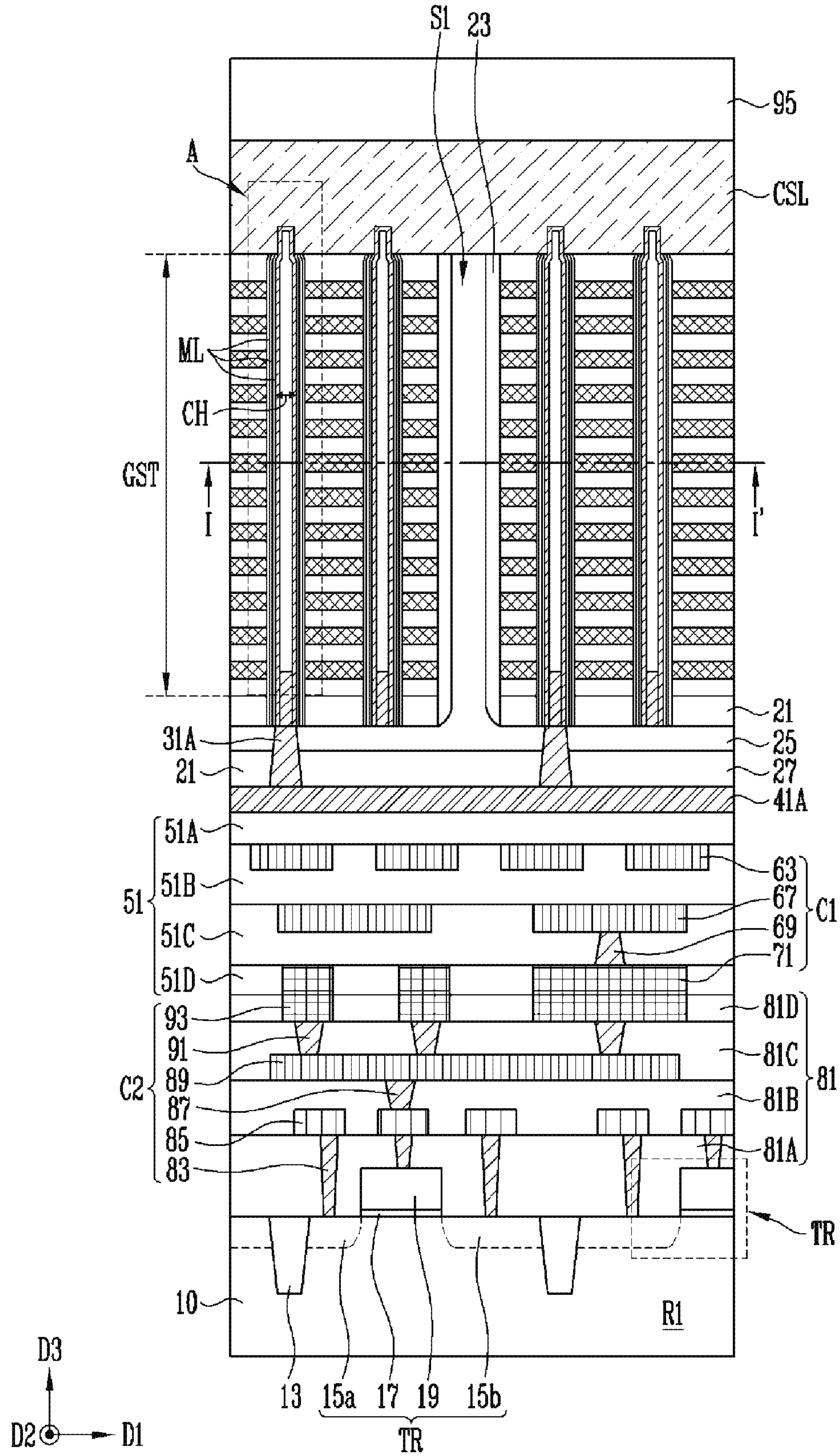
FIG. 2 is a sectional view illustrating an embodiment of a memory cell array overlapping with a first region of a substrate shown in FIG. 1.

FIG. 2 is a sectional view illustrating an embodiment of the memory cell array MCA overlapping with the first region R1 of the substrate 10 shown in FIG. 1.

Referring to FIG. 2, the memory array cell MCA described with reference to FIG. 1 may include gate stack structures GST separated by a slit SI, channel structures CH penetrating the gate stack structures GST, and a memory layer ML extending along a sidewall of each of the channel structures CH.

The gate stack structures GST may be spaced apart from the first region R1 of the substrate 10 in a vertical direction D3. Each of the gate stack structures GST may extend in a first direction D1 and a second direction D2 on a plane intersecting the vertical direction D3. A line extending in the first direction D1 and a line extending in the second direction D2 may intersect each other. In an embodiment, the line extending in the first direction D1 and the line extending in the second direction D2 may be orthogonal to each other.

Each of the gate stack structures GST may include a sidewall defined by the slit SI. The slit SI may extend in the vertical direction D3.

Figure 3:
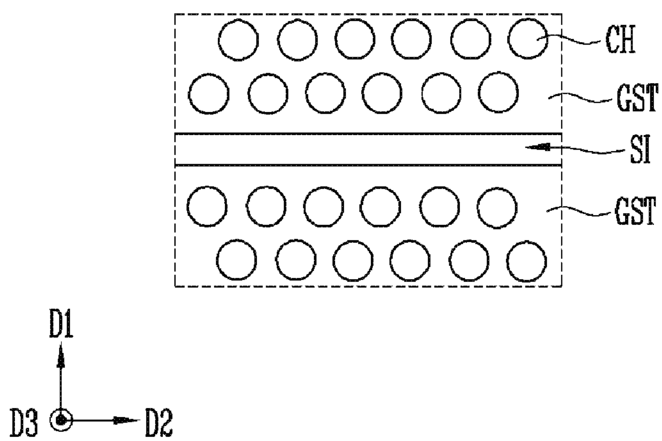
FIG. 3 is a plan view illustrating gate stack structures shown in FIG. 2.

FIG. 3 is a plan view illustrating the gate stack structures GST shown in FIG. 2, and illustrates a cross-section of each of the gate stack structures GST, which is taken along line I-I' shown in FIG. 2.

Referring to FIG. 3, the slit SI may have a straight line shape extending in the second direction D2. However, the present disclosure is not limited thereto. For example, the slit SI may be formed in various shapes such as a zigzag shape and a wave shape, which extend in the second direction.

Each of the gate stack structures GST may be penetrated by a plurality of channel structures CH. The plurality of channel structures CH may be arranged in zigzag. However, the present disclosure is not limited thereto. For example, the plurality of channel structures CH may be arranged in a matrix structure.

Referring back to FIG. 2, a sidewall insulating layer 23 may be formed on the sidewall of each of the gate stack structures GST.

One end of each of the channel structures CH may be connected to a common source line CSL. The common source line CSL is a portion of the second line array L2A described with reference to FIG. 1, and may extend to overlap with the gate stack structures GST. The channel structures CH may farther protrude than the gate stack structures GST, and extend to the inside of the common source line CSL. The common source line CSL may be covered by a protective insulating layer 95. The protective insulating layer 95 may include an oxide layer.

The other end of each of the channel structures CH may be connected to a bit line 41A corresponding thereto. The bit line 41A is a portion of the first line array L1A described with reference to FIG. 1, and may extend in the first direction D1.

A first insulating layer 21, a second insulating layer 25, and a third insulating layer 27 may be disposed between the bit line 41A and the gate stack structures GST. The first insulating layer 21 may surround a lower end of each of channel structures CH adjacent to the bit line 41A. The first insulating layer 21 may extend to overlap with the gate stack structures GST. The first insulating layer 21 may be penetrated by the slit SI. The sidewall insulating layer 23 may extend onto a sidewall of the first insulating layer 21. The second insulating layer 25 may fill the slit SI, and extend to cover a surface of the first insulating layer 21. The third insulating layer 27 may be disposed between the second insulating layer 25 and the bit line 41A. However, the present disclosure is not limited thereto. For example, at least one of the first to third insulating layers 21, 25, and 27 may be omitted.

The bit line 41A may be connected to a channel structure CH corresponding thereto via a first contact plug 31A. The first contact plug 31A may be formed of a conductive material penetrating the second insulating layer 25 and the third insulating layer 27, and be in contact with the bit line 41A and a channel structure CH corresponding thereto.

The memory cell string STR described with reference to FIG. 1 may be defined along each channel structure CH connected to the bit line 41A and the common source line CSL. Region A represents a longitudinal sectional structure of a memory cell string.

Figure 4:
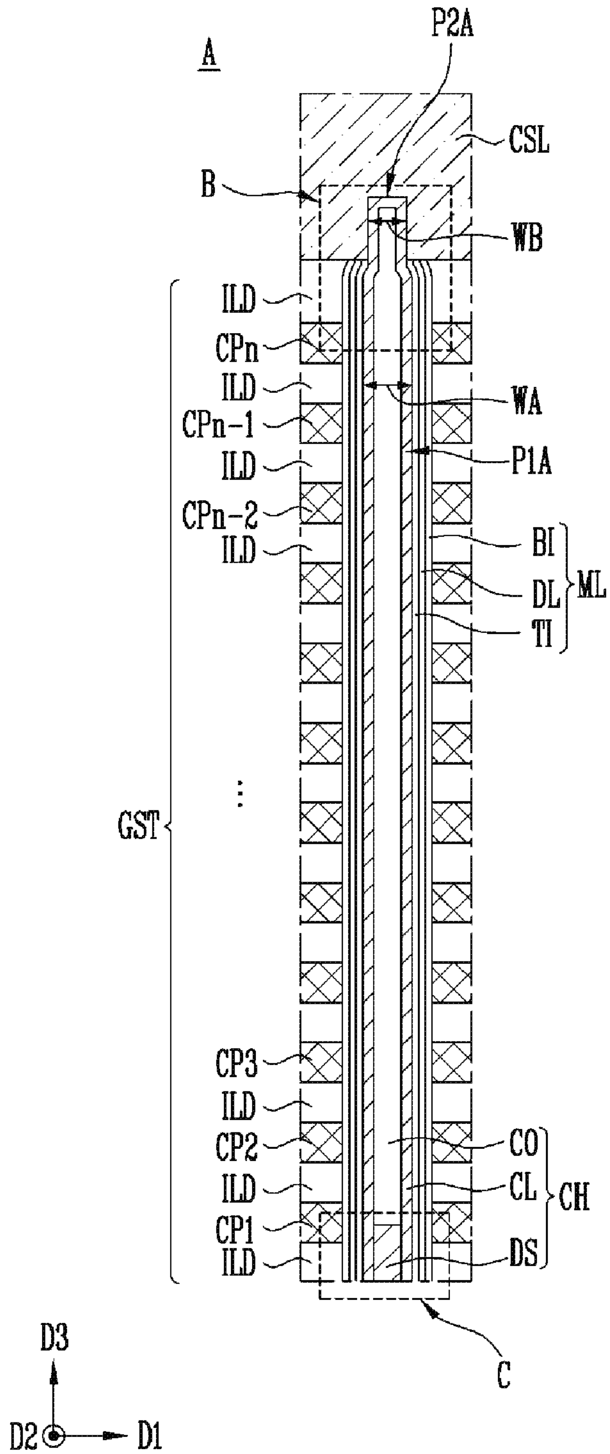
FIG. 4 is an enlarged sectional view of region A shown in FIG. 2.

FIG. 4 is an enlarged sectional view of the region A shown in FIG. 2.

Referring to FIG. 4, the gate stack structure GST may include interlayer insulating layers ILD and conductive patterns CP1 to CPn, which are alternately stacked in the vertical direction D3. Each of the conductive patterns CP1 to CPn may include various conductive materials such as a doped silicon layer, a metal layer and a metal silicide layer, and a barrier layer, and include two or more kinds of conductive materials. For example, each of the conductive patterns CP1 to CPn may include tungsten and a titanium nitride layer (TiN) surrounding the surface of the tungsten. The tungsten is a low-resistance metal, and may decrease the resistance of the conductive patterns CP1 to CPn. The titanium nitride layer (TiN) is a barrier layer, and may prevent direct contact between the tungsten and the interlayer insulating layers ILD.

An nth conductive pattern CPn adjacent to the common source line CSL among the conductive patterns CP1 to CPn may be used as the source select line SSL described with reference to FIG. 1. A first conductive pattern CP1 adjacent to the bit line 41A shown in FIG. 2 among the conductive patterns CP1 to CPn may be used as the drain select line DSL described with reference to FIG. 1. However, the present disclosure is not limited thereto. For example, two or more conductive patterns that are adjacent to the common source line CSL and are consecutively stacked may be used as source select lines, and two or more conductive patterns that are adjacent to the bit line 41A shown in FIG. 2 and are consecutively stacked may be used as drain select lines. Conductive patterns (e.g., CP2 to CPn−1) disposed between source and drain select lines adjacent to each other may be used as the word lines WL described with reference to FIG. 1.

The channel structure CH may include a first part P1A and a second part P2A. The first part P1A may be defined as a portion of the channel structure CH penetrating the gate stack structure GST. The first part P1A may extend to the inside of the first insulating layer 21 shown in FIG. 2. The second part P2A may be defined as a portion of the channel structure CH, which farther protrudes toward the common source line CSL than the gate stack structure GST. In an embodiment, the channel structure CH has the first part P1A penetrating the gate stack structure GST and the second part P2A extending from one end of the first part P1A, the second part P2A extending beyond the gate stack structure GST. The second part P2A may be surrounded by the common source line CSL. A diameter WA of the first part P1A may be greater than the diameter WB of the second part P2A.

The sidewall of the channel structure CH may be surrounded by a memory layer ML. The memory layer ML may be disposed between the first part P1A and the gate stack structure GST, and extend between the first part P1A and the first insulating layer 21 shown in FIG. 2. The memory layer ML may include a tunnel insulating layer TI, a data storage layer DL, and a blocking insulating layer BI, which are stacked toward the gate stack structure GST from a sidewall of the first part P1A. The tunnel insulating layer TI may include silicon oxide through which charges can tunnel. The data storage layer DL may be formed of a charge trapping layer. For example, the charge trapping layer may include silicon nitride. The blocking insulating layer BI may include an oxide capable of blocking charges. The data storage layer DL may be formed of various materials except the charge trapping layer. For example, the data storage layer DL may be formed of a material layer including conductive nano dots, be formed of a phase change material layer, or be formed of a material layer for floating gates. The data storage layer DL may be formed in various forms between the tunnel insulating layer TI and the blocking insulating layer BI according to the structure of a cell to be implemented The channel structure CH may include a channel layer CL, a core insulating layer CO, and a doped semiconductor layer DS. The channel layer CL may be formed in a hollow type. The core insulating layer CO and the doped semiconductor layer DS may be disposed in a central region of the channel structure CH. The doped semiconductor layer DS may be disposed between the core insulating layer CO and the bit line 41A shown in FIG. 2. In an embodiment, the doped semiconductor layer DS may be in contact with the first contact plug 31A shown in FIG. 2, and fill a central region of the channel layer CL. The channel layer CL may extend between the doped semiconductor layer DS and the memory layer ML and between the core insulating layer CO and the memory layer ML. A portion of the channel layer CL may extend to the inside of the common source line CSL to constitute the second part P2A of the channel structure CH. The portion of the channel layer CL, which constitutes the second part P2A, may be in direct contact with the common source line CSL. In other words, the portion of the channel layer CL, which constitutes the second part P2A, may be disposed between the common source line CSL and the core insulating layer CO.

The channel structure CH is not limited to the example shown in the drawing. For example, the channel structure CH may include an embedded type channel layer embedded in the central region of the channel structure CH, and the core insulating layer CO may be omitted.

The channel layer CL is used as a channel region of a memory cell string corresponding thereto. The channel layer CL may be formed of a semiconductor material. In an embodiment, the channel layer CL may include a silicon layer. Conductivity type dopants may be distributed at both ends of the channel layer CL. For example, the conductivity type dopants may be distributed at both ends of the channel layer CL, which are indicated in region B and region C. The region B includes one end of the channel layer CL, which is adjacent to the common source line CSL, and the region C includes the other end of the channel layer CL, which is adjacent to the doped semiconductor layer DS. The conductivity type dopant may include an n-type dopant for junctions. The conductivity type dopant may include a counter-doped p-type dopant.

According to the above-described structure, memory cells may be defined at intersection portions of the channel structure CH and the conductive patterns (e.g., CP2 to CPn−1) used as the word lines, a drain select transistor may be defined at an intersection portion of the channel structure CH and the conductive pattern (e.g., CP1) used as the drain select line, and a source select transistor may be defined at an intersection portion of the channel structure CH and the conductive pattern (e.g., CPn) used as the source select line. The memory cells are zo connected in series between the drain select transistor and the source select transistor by the channel structure CH, to constitute the memory cell string STR described with reference to FIG. 1.

Referring back to FIG. 2, the memory layer ML may be formed shorter in the vertical direction D3 than the channel structure CH.

The bit line 41A may be spaced apart from the substrate 10 by a first insulating structure 51 and a second insulating structure 81. The first insulating structure 51 may include two or more insulating layers. In an embodiment, the first insulating structure 51 may include insulating layers 51A to 51D stacked between the bit line 41A and the second insulating structure 81. The second insulating structure 81 may include two or more insulating layers. In an embodiment, the second insulating structure 81 may include insulating layers 81A to 81D stacked between the substrate 10 and the first insulating structure 51.

The substrate 10 may include a Complementary Metal Oxide Semiconductor (CMOS) circuit. The substrate 10 may be a bulk silicon substrate, a silicon on insulator substrate, a germanium substrate, a germanium on insulator substrate, a silicon-germanium substrate, or an epitaxial film formed through a selective epitaxial growth process.

The CMOS circuit may include a plurality of transistors TR constituting a peripheral circuit for driving a memory cell array. The plurality of transistors TR may include an NMOS transistor and a PMOS transistor. The transistors TR may be disposed on active regions of the substrate 10, which are divided by isolation layers 13. Each of the transistors TR may include a gate insulating layer 17 and a gate electrode 19, which are disposed on an active region corresponding thereto, and include junctions 15*a* and 15*b* formed in active regions at both sides of the gate electrode 19. The junctions 15*a* and 15*b* may include conductivity type dopants. For example, the conductivity type dopants included in the junctions 15*a* and 15*b* may include at least one of an n-type dopant and a p-type dopant according to characteristics of a transistor to be implemented.

The transistors TR of the CMOS circuit may be electrically connected to the memory cell array MCA described with reference to FIG. 1 via first connection structures C1 and second connection structures C2. The interconnection array ICA described with reference to FIG. 1 may be used for the purpose of the electrical connection between the transistors TR of the COMS circuit and the memory cell array MCA.

Figure 5:
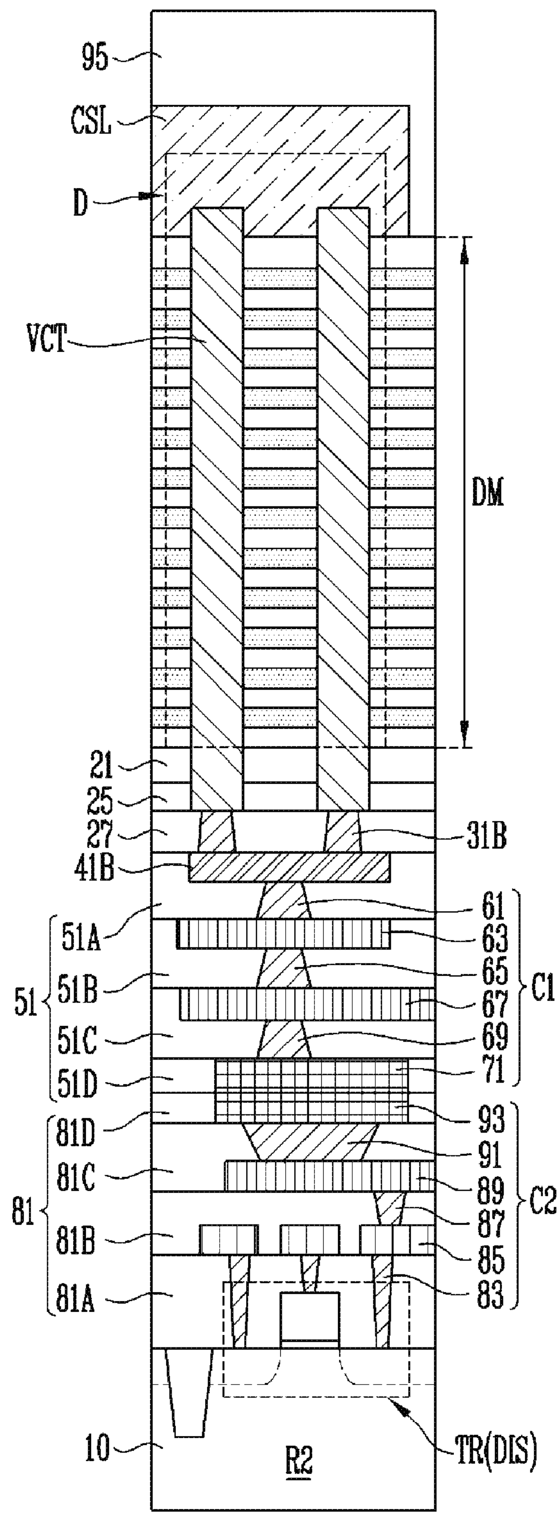
FIG. 5 is a sectional view illustrating an embodiment of an interconnection array overlapping with a second region of the substrate shown in FIG. 1.

FIG. 5 is a sectional view illustrating an embodiment of the interconnection array ICA overlapping with the second region R2 of the substrate 10 shown in FIG. 1.

Referring to FIG. 5, the interconnection array ICA described with reference to FIG. 1 may include a dummy stack structure DM and a vertical contact plug VCT penetrating the dummy stack structure DM.

The dummy stack structure DM may overlap with the second region R2 of the substrate 10, and be disposed at a level substantially equal to that of the gate stack structure GST described with reference to FIG. 2. The dummy stack structure DM may be covered by the common source line CSL extending to be connected to the vertical contact plug VCT. The dummy stack structure DM may be disposed between the common source line CSL and a connection line 41B.

The connection line 41B is a portion of the first line array L1A described with reference to FIG. 1. The connection line 41B may be disposed at a level substantially equal to that of the bit line 41A described with reference to FIG. 2, and be formed of the same conductive material as the bit line 41A. The first insulating layer 21, the second insulating layer 25, and the third insulating layer 27, which are described with reference to FIG. 2, may extend between the dummy stack structure DM and the connection line 41B.

The vertical contact plug VCT may penetrate the dummy stack structure DM. The vertical contact plug VCT may extend to the inside of the common source line CSL, and penetrate the first insulating layer 21 and the second insulating layer 25. The vertical contact plug VCT may be connected to the connection line 41B via a second contact plug 31B penetrating the third insulating layer 27. In another embodiment, the vertical contact plug VCT may extend to be in direct contact with the connection line 41B. The vertical contact plug VCT may be formed of various conductive materials. A partial length of the vertical contact plug VCT extending to the inside of the common source line CSL may be equal to or different from that of the channel structure (CH shown in FIG. 2) extending to the inside of the common source line CSL.

The insulating layers 51A to 51D of the first insulating structure 51 and the insulating layers 81A to 81D of the second insulating structure 81, which are described with reference to FIG. 2, may extend between the second region R2 of the substrate 10 and the connection line 41B.

The protective insulating layer 95 described with reference to FIG. 2 may extend to cover the common source line CSL and the dummy stack structure DM, which are shown in FIG. 5.

Other transistors TR constituting a CMOS circuit may be disposed in the second region R2 of the substrate 10. In an embodiment, a discharge transistor DIS may be disposed in the second region R2 of the substrate 10.

Referring to FIGS. 2 and 5, each of the first connection structures C1 may include various conductive patterns 61, 63, 65, 67, 69, and 71 embedded in the first insulating structure 51. Each of the second connection structures C2 may be connected to one corresponding thereto among the transistors TR constituting the CMOS circuit. Each of the second connection structures C2 may include various conductive patterns 83, 85, 87, 89, 91, and 93 embedded in the second insulating structures 81. The structure of each of the first connection structures C1 and the second connection structures C2 is not limited to the example shown in FIGS. 2 and 5, and may be variously modified.

Each of the first connection structures C1 may include a first bonding metal 71, and each of the second connection structure C2 may include a second bonding metal 93. The first bonding metal 71 and the second bonding metal 93 may be disposed to face each other, and be adhered to each other.

Referring back to FIG. 5, the discharge transistor DIS may be connected to the connection line 41B via a second connection structure C2 and the first connection structure C1, which correspond to the discharge transistor DIS. The connection line 41B, the second contact plug 31B, and the vertical contact plug VCT may connect the discharge transistor DIS to the common source line CSL.

Figure 6:
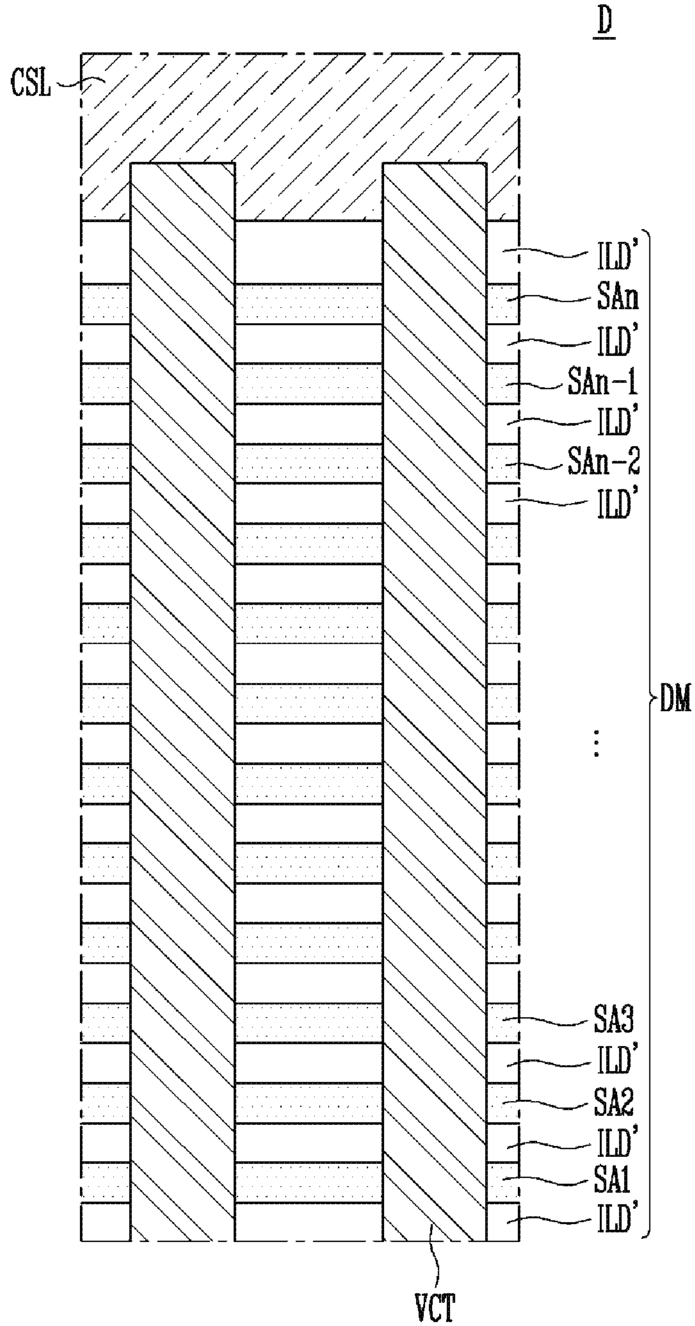
FIG. 6 is an enlarged sectional view of region D shown in FIG. 5.

FIG. 6 is an enlarged sectional view of region D shown in FIG. 5.

Referring to FIG. 6, the dummy stack structure DM may include dummy interlayer insulating layers ILD' and sacrificial layers SA1 to SAn, which are alternately stacked in the vertical direction. The dummy interlayer insulating layer ILD' may be disposed at levels substantially equal to those of the interlayer insulating layers ILD shown in FIG. 4. The sacrificial layers SA1 to SAn may be disposed at levels substantially equal to those of the conductive patterns CP1 to CPn shown in FIG. 4.

The interlayer insulating layers ILD and the dummy interlayer insulating layers ILD' may be formed of the same material layer. The sacrificial layers SA1 to SAn may be formed of a material having an etching rate different from those of the interlayer insulating layers ILD and the dummy interlayer insulating layers ILD'. For example, the interlayer insulating layers ILD and the dummy interlayer insulating layers ILD' may include silicon oxide, and the sacrificial layers SA1 to SAn may include silicon nitride.

The dummy stack structure DM is not limited to the examples shown in FIG. 6. For example, the dummy stack structure DM may include dummy interlayer insulating layers and dummy conductive patterns, which are alternately stacked in the vertical direction. The dummy conductive patterns may be disposed at levels substantially equal to those of the conductive patterns CP1 to CPn shown in FIG. 4, and be formed of the same conductive material as the conductive patterns CP1 to CPn shown in FIG. 4. When the dummy stack structure DM includes the dummy conductive patterns, a sidewall of the vertical contact plug VCT penetrating the dummy stack structure DM may be surrounded by an insulating material.

Figure 7:
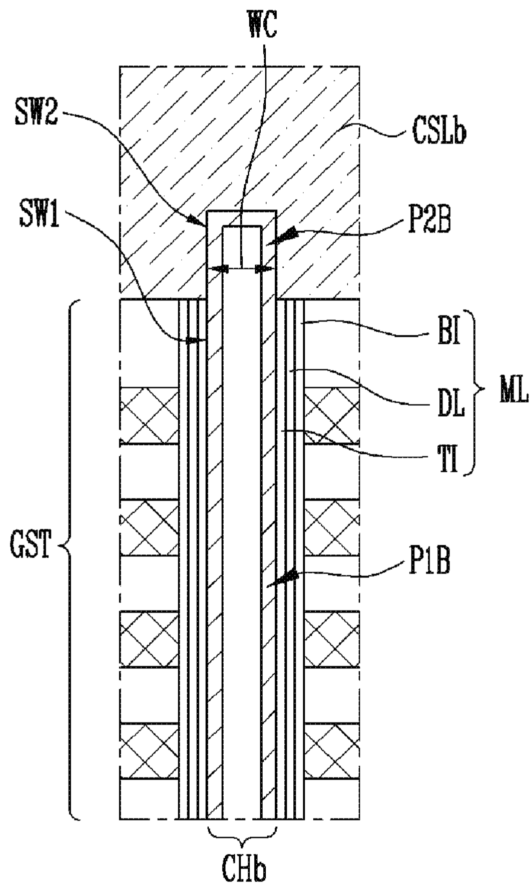
FIGS. 7 and 8 are sectional views illustrating various embodiments of channel structures.
Figure 8:
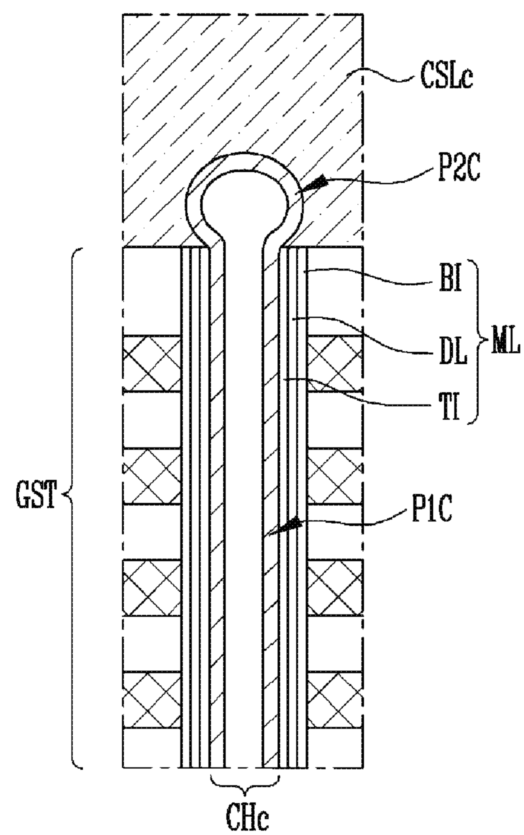

FIGS. 7 and 8 are sectional views illustrating various embodiments of the channel structures. A gate stack structure GST and a memory layer ML, which are shown in FIGS. 7 and 8, are substantially similar to the gate stack structure GST and the memory layer ML, which are described with reference to FIGS. 2 and 4. In an embodiment, the gate stack structure GST may include interlayer insulating layers and conductive patterns, which are alternately stacked in the vertical direction.

Referring to FIG. 7, a channel structure CHb may include a first part P1B penetrating a gate stack structure GST and a second part P2B extending to the inside of a common source line CSLb from an end portion of the first part P1B.

The memory layer ML may surround the first part P1B of the channel structure CHb and the memory layer ML may include a tunnel insulating layer TI, a data storage layer DL, and a blocking insulating layer BI.

The second part P2B of the channel structure CHb may have a sidewall SW2 aligned on a straight line with a sidewall SW1 of the first part P1B. A diameter WC of the second part P2B, which is inserted into the common source line CSLb, may be greater than the diameter WB of the second part P2A shown in FIG. 4.

Referring to FIG. 8, a channel structure CHc may include a first part P1C penetrating a gate stack structure GST and a second part P2C extending to the inside of a common source line CSLc from an end portion of the first part P1C.

The first part P1C of the channel structure CHc may be surrounded by a memory layer ML including a tunnel insulating layer TI, a data storage layer DL, and a blocking insulating layer BI.

The second part P2C of the channel structure CHc may have a shape rounded toward the common source line CSLc. For example, the second part P2C of the channel structure CHc may be formed in a bulb shape. A concave portion defined in the common source line CSLc, into which the second part P2C is inserted, may be formed in a round shape. In an embodiment, a convex shaped second part P2C of the channel structure CHc may extend beyond the first part P1C of the channel structure CHc and this convex shaped second part P2C is defined by the concave portion located in the common source line CSLc.

The common source line CSL shown in each of FIGS. 2, 4, 5, and 6, the common source line CSLb shown in FIG. 7, and the common source line CSLc shown in FIG. 8 may include a metal. In an embodiment, each of the common source lines CSL, CSLb, and CSLc may include a barrier layer and a metal layer. The barrier layer may be formed to prevent direct contact between the metal layer and a channel structure corresponding thereto and to prevent diffusion of metal into the channel structure. For example, the barrier layer may include a titanium nitride layer, etc. The metal layer may include various metals such as aluminum.

Figure 9:
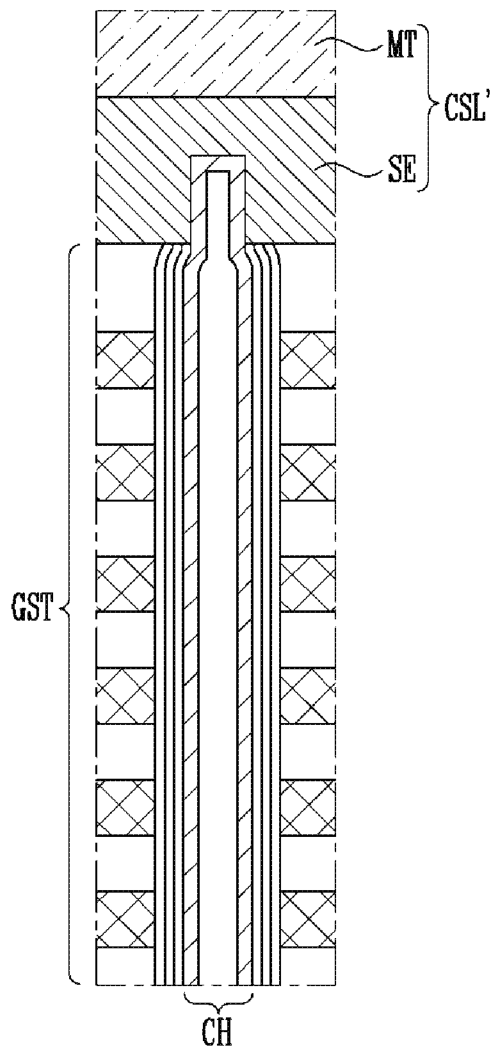
FIGS. 9 and 10 are sectional views illustrating an embodiment of a common source line.
Figure 10:
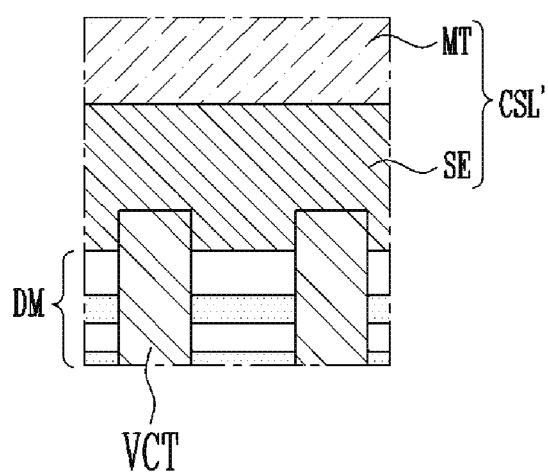

FIGS. 9 and 10 are sectional views illustrating an embodiment of a common source line CSL'. FIG. 9 illustrates a portion of the common source line CSL' overlapping with a gate stack structure GST, and FIG. 10 illustrates another portion of the common source line CSL' overlapping with a dummy stack structure DM. The gate stack structure GST shown in FIG. 9 is identical to the gate stack structure GST described with reference to FIGS. 2 and 4, and the dummy stack structure DM shown in FIG. 10 is identical to the dummy stack structure DM described with reference to FIGS. 5 and 6.

Referring to FIGS. 9 and 10, the common source line CSL' may include a source-side doped semiconductor layer SE in direct contact with a channel structure CH and a vertical contact plug VCT and a metal layer MT disposed on a surface of the source-side doped semiconductor layer SE. Although not shown in the drawings, a barrier layer such as a titanium nitride layer (TiN) may be further formed between the metal layer MT and the source-side doped semiconductor layer SE. The metal layer MT may include various metals such as aluminum.

Adhesion between the common source line CSL' and the channel structure CH may be reinforced by the source-side doped semiconductor layer SE. The source-side doped semiconductor layer SE may include at least one of an n-type dopant and a p-type dopant.

The metal layer MT may be connected to the channel structure CH and the vertical contact plug VCT via the source-side doped semiconductor layer SE.

Figure 11:
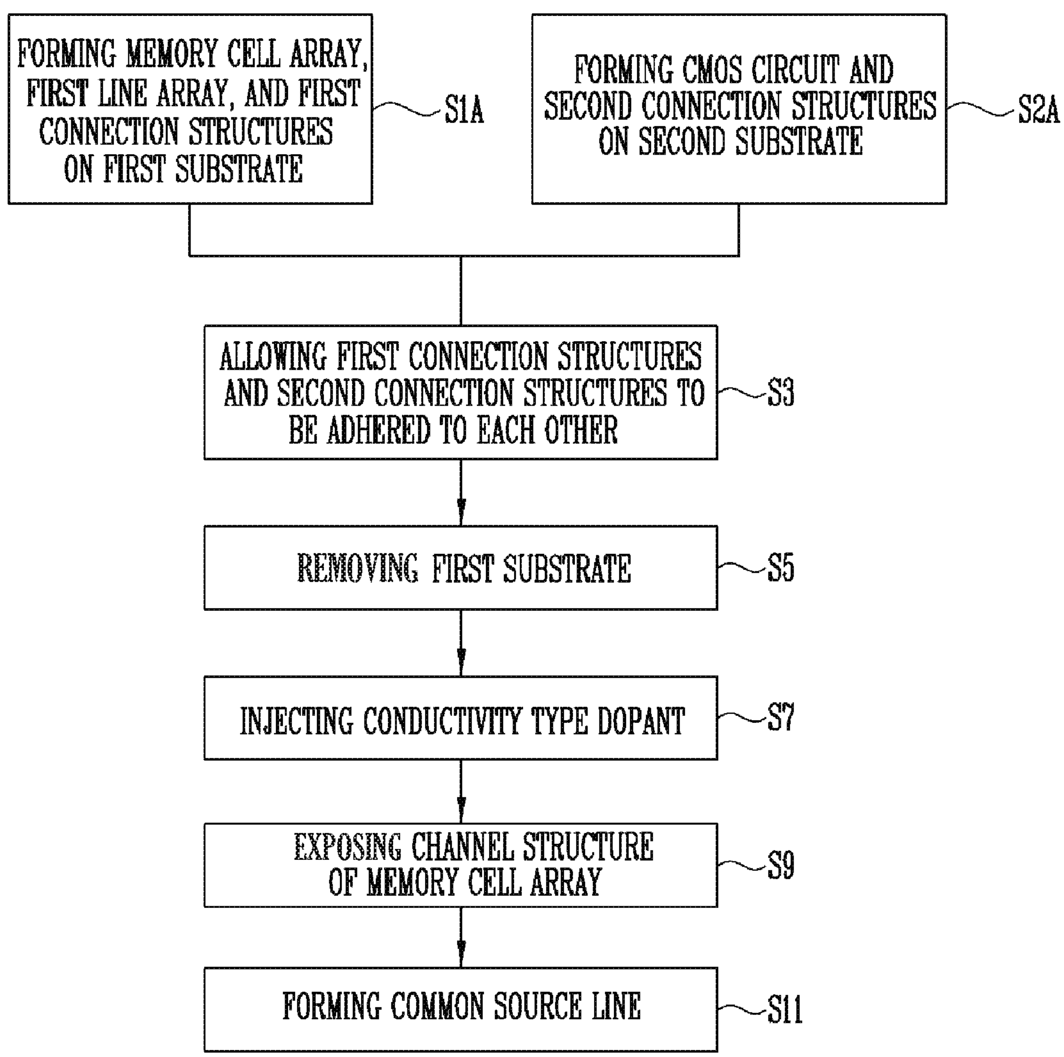
FIG. 11 is a flowchart schematically illustrating a manufacturing method of the semiconductor memory device in accordance with an embodiment of the present disclosure.

FIG. 11 is a flowchart schematically illustrating a manufacturing method of the semiconductor memory device in accordance with an embodiment of the present disclosure.

Referring to FIG. 11, the manufacturing method of the semiconductor memory device may include step S1A of forming a memory cell array, a first line array, and first connection structures on a first substrate, step S2A of forming a CMOS circuit and second connection structures on a second substrate, step S3 of allowing the first connection structures and the second connection structures to be adhered to each other, step S5 of removing the first substrate, step S7 of injecting a conductivity type dopant, step S9 of exposing a channel structure of the memory cell array, and step S11 of forming a common source line connected to the channel structure.

FIGS. 12A to 12F, 13 to 17, and 18A to 18C are sectional views of processes, illustrating a manufacturing method of the semiconductor memory device in accordance with an embodiment of the present disclosure.

FIGS. 12A to 12F are sectional views illustrating an embodiment of the step S1A shown in FIG. 11.

Figure 12A:
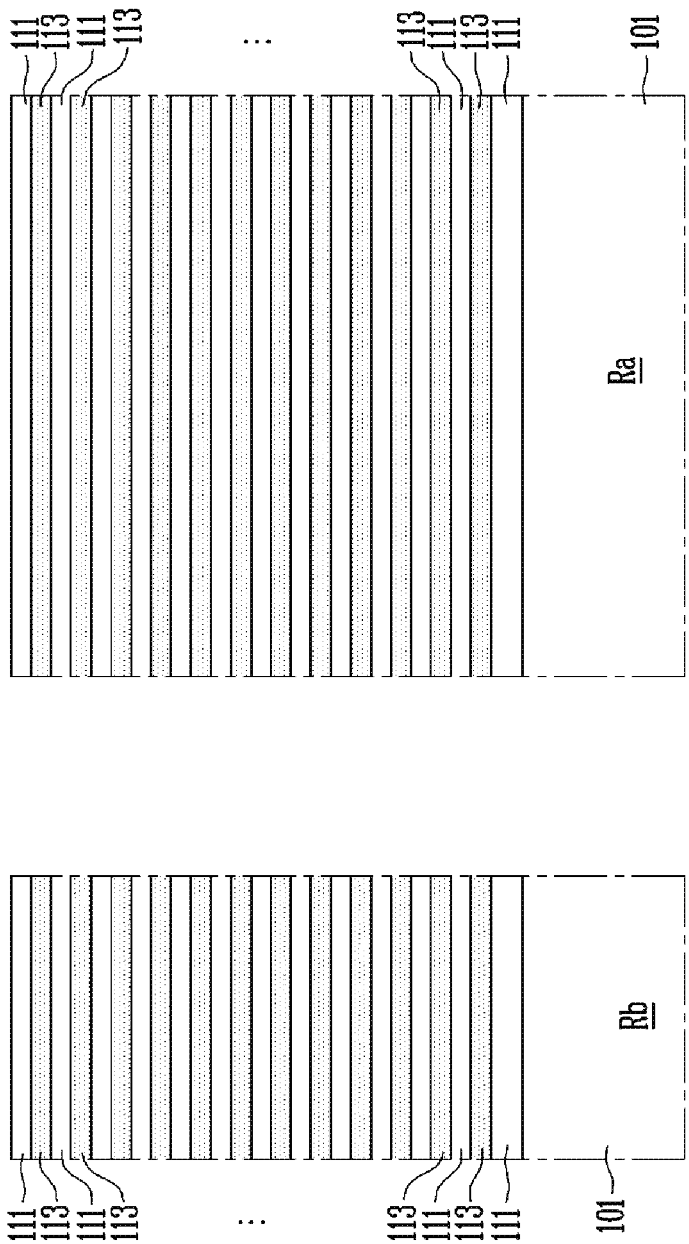
FIGS. 12A, 12B, 12C, 12D, 12E, and 12F, 13, 14, 15, 16, and 17, and 18A, 18B, and 18C are sectional views of processes, illustrating a manufacturing method of the semiconductor memory device in accordance with an embodiment of the present disclosure.

Referring to FIG. 12A, the step S1A may include a step of alternately stacking first material layers 111 and second material layers 113 on a first substrate 101 including a cell region Ra and an interconnection region Rb.

The first substrate 101 may be formed of a material having an etching rate different from those of the first material layers 111 and the second material layers 113. For example, the substrate 101 may include silicon.

In an embodiment, the first material layers 111 may be an insulating material for the interlayer insulating layers ILD described with reference to FIG. 4 and the dummy interlayer insulating layers ILD' described with reference to FIG. 6. The second material layers 113 is a material for the sacrificial layers SA1 to SAn described with reference to FIG. 6, and may be a material having an etching rate different from those of the interlayer insulating layers ILD described with reference to FIG. 4 and the dummy interlayer insulating layers ILD' described with reference to FIG. 6. For example, the first material layers 111 may include silicon oxide, and the second material layers 113 may include silicon nitride. The following drawings illustrate an embodiment in which the first material layers 111 are formed of an insulating material and the second material layers 113 are formed of sacrificial layers, but the present disclosure is not limited thereto. Properties of the first material layers 111 and the second material layers 113 may be variously modified. For example, the first material layers 111 may be an insulating material for the interlayer insulating layers ILD described with reference to FIG. 4 and the dummy interlayer insulating layers ILD' described with reference to FIG. 6, and the second material layers 113 may be a conductive material for the conductive patterns CP1 to CPn described with reference to FIG. 4.

Figure 12B:
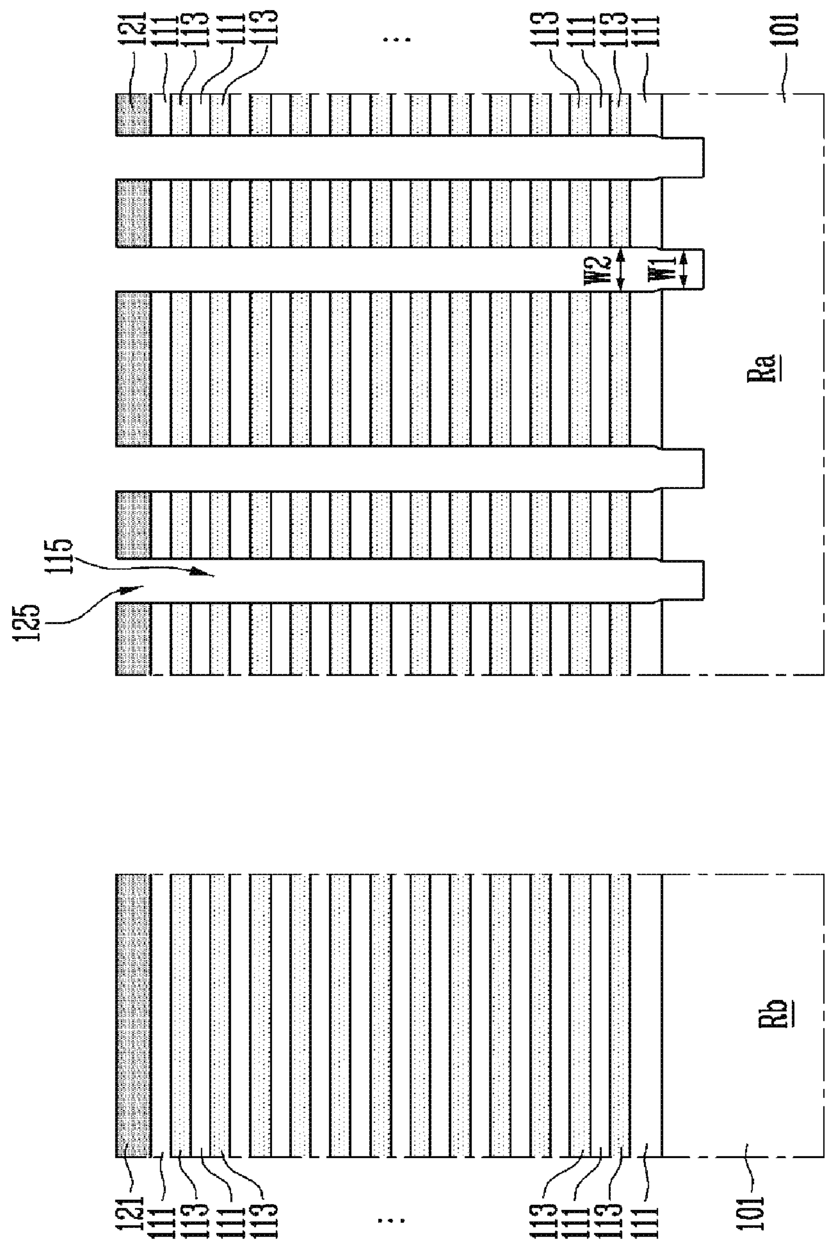

Referring to FIG. 12B, a first mask pattern 121 including a first opening 125 may be formed on the stacked structure of the first material layers 111 and the second material layers 113. Subsequently, a channel hole 115 penetrating the first material layers 111 and the second material layers 113 may be formed through the first opening 125 of the first mask pattern 121. The channel hole 115 may extend to the inside of the cell region Ra of the first substrate 101. The channel hole 115 may be formed in various shapes according to etching materials used to form the channel hole 115.

In an embodiment, the channel hole 115 may be formed using a first etching material. An etching speed of the first material layers 111 and the second material layers 113 with respect to the first etching material may be faster than that of the first substrate 101 with respect to the first etching material. As a result, a width W1 of an end portion of the channel hole 115, which extends to the inside of the first substrate 101, may be formed narrower than that W2 of a main region of the channel hole 115, which penetrates the first material layers 111 and the second material layers 113.

In another embodiment, the step of forming the channel hole 115 may include a step of performing an etching process using the above-described first etching material and a step of widening the width of the end portion of the channel hole 115 by using a second etching material for isotropically etching the first substrate 101. The end portion of the channel hole 115 may be formed in various structures through isotropic etching. For example, the end portion of the channel hole 115 may have various structures as shown in FIG. 7 or 8.

Figure 12C:
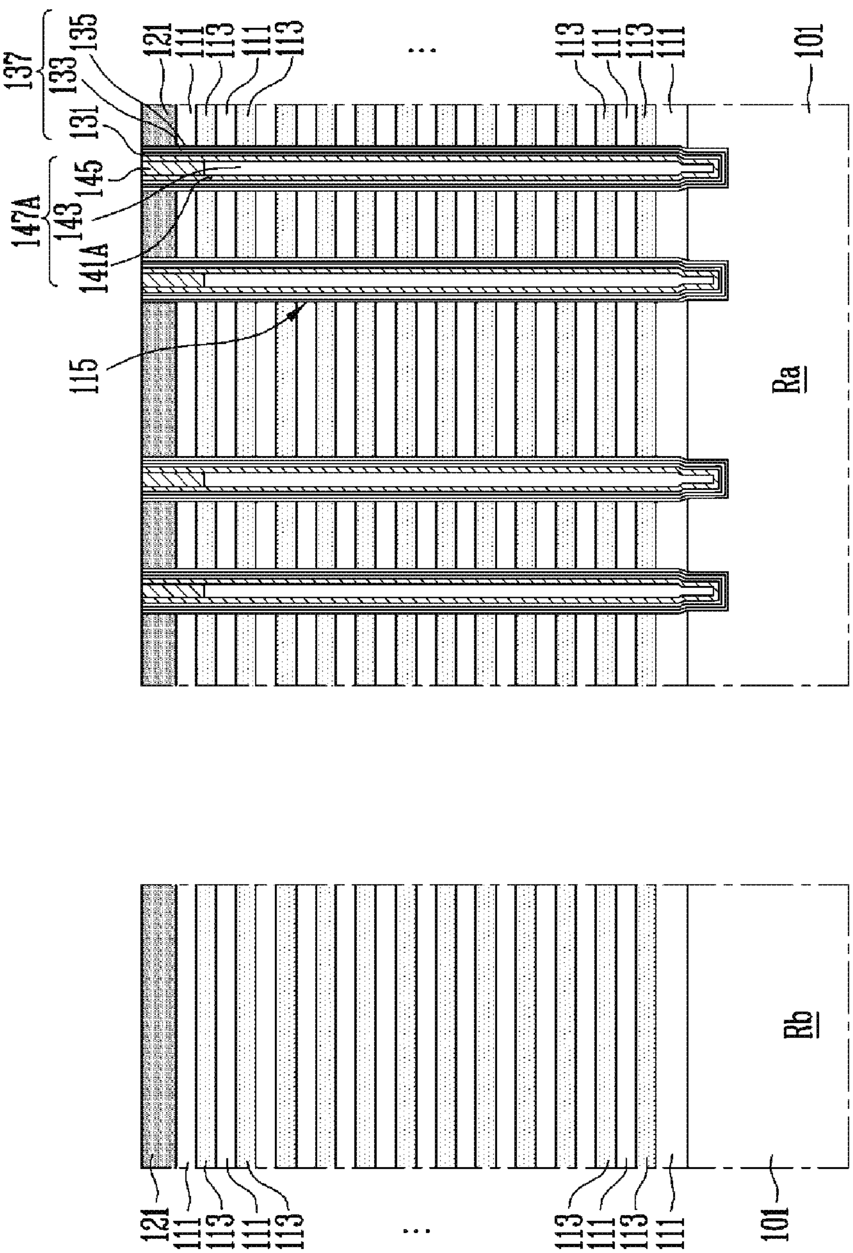

Referring to FIG. 12C, a memory layer 137 and a channel structure 147A may be formed in the channel hole 115. A sidewall of the channel structure 147A and an end portion of the channel structure 147A, which extends to the inside of the first substrate 101, may be surrounded by the memory layer 137.

The step of forming the memory layer 137 may include a step of sequentially stacking a blocking insulating layer 135, a data storage layer 133, and a tunnel insulating layer 131 on a surface of the channel hole 115. The blocking insulating layer 135, the data storage layer 133, and the tunnel insulating layer 131 may include the same materials as the blocking insulating layer BI, the data storage layer DL, and the tunnel insulating layer TI, which are described with reference to FIG. 4. The memory layer 137 may be formed in a liner shape, and a central region of the channel hole 115 may be defined by the memory layer 137.

The step of forming the channel structure 147A may include a step of forming a channel layer 141A on a surface of the memory layer 137. The channel layer 141A may include a semiconductor layer used as a channel region. For example, the channel layer 141A may include silicon.

In an embodiment, the channel layer 141A may be formed in a liner shape, and the central region of the channel hole 115 may include a portion that is not filled with the channel layer 141A. When the channel layer 141A is formed in the liner shape, the step of forming the channel structure 147A may include a step of filling the central region of the channel hole 115 with a core insulating layer 143 on the channel layer 141A, a step of defining a recess region at a portion of the central region of the channel hole 115 by etching a portion of the core insulating layer 143, and a step of filling the recess region with a doped semiconductor layer 145. The core insulating layer 143 may include oxide, and the doped semiconductor layer 145 may include a conductivity type dopant. The conductivity type dopant may include an n-type dopant for junctions. The conductivity type dopant may include a counter-doped p-type dopant.

In another embodiment, the channel layer 141A may be formed to fill the central region of the channel hole 115, and the core insulating layer 143 and the doped semiconductor layer 145 may be omitted. When the core insulating layer 143 and the doped semiconductor layer 145 are omitted, the step of forming the channel structure 147A may further include a step of doping the conductivity type dopant into the channel layer 141A.

Figure 12D:
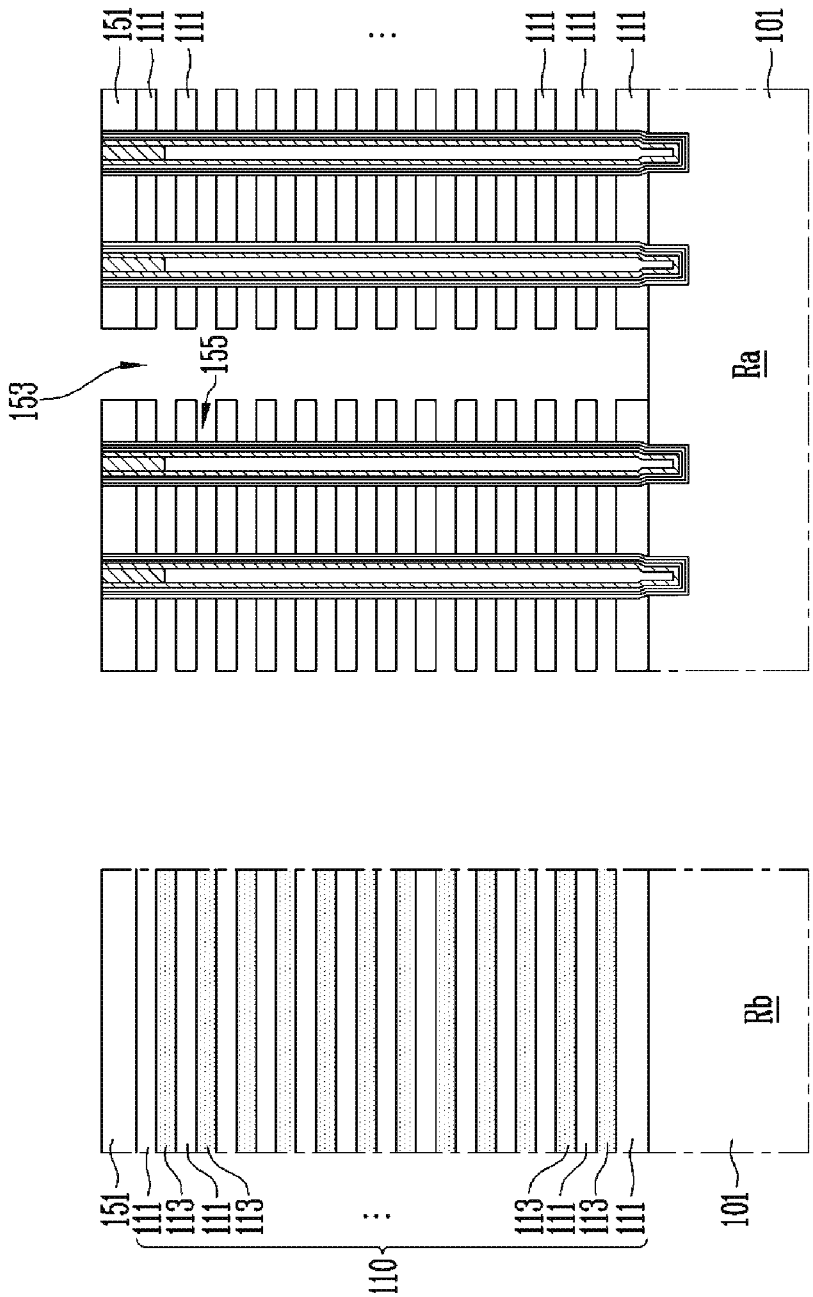

Referring to FIG. 12D, a first insulating layer 151 may be formed after the first mask pattern 121 shown in FIG. 12C is removed.

Subsequently, a slit 153 may be formed. The slit 153 may penetrate the first insulating layer 151, and penetrate the stacked structure of the first material layers 111 and the second material layers 113. The slit 153 may correspond to the slit SI shown in FIGS. 2 and 3. Subsequently, horizontal spaces 155 may be defined by selectively removing the second material layers 113 overlapping with the cell region RA of the first substrate 101 through the slit 153. The horizontal spaces 155 may be defined between the first material layers 111 that overlap with the cell region Ra of the first substrate 101 and are adjacent to each other in a vertical direction. The second material layers 113 overlapping with the interconnection region Rb of the first substrate 101 are not removed and may remain. The first material layers 111 and the second material layers 113, which overlap with the interconnection region Rb of the first substrate 101, may remain as a dummy stack structure 110.

Figure 12E:
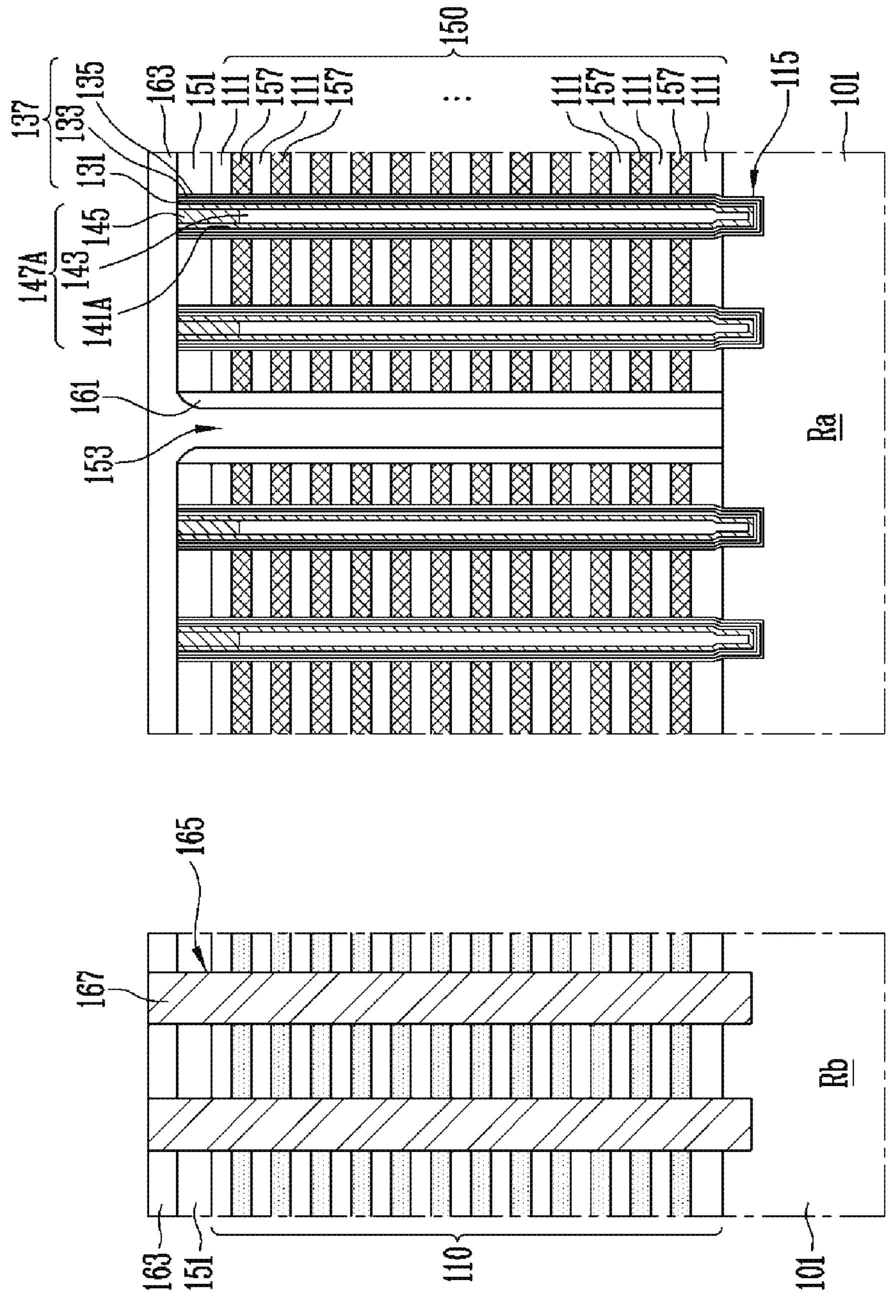

Referring to FIG. 12E, the horizontal spaces 155 shown in FIG. 12D are respectively filled with third material layers 157 through the slit 153. The third material layers 157 may be the conductive patterns CP1 to CPn described with reference to FIG. 4. The third material layers 157 may fill the horizontal spaces 155 to surround the channel structure 147A and the memory layer 137.

As described above, a gate stack structure 150 may be formed on the cell region Ra of the first substrate 101 by replacing the second material layers 113 as sacrificial layers formed on the cell region Ra of the first substrate 101 with the third material layers 157 as conductive patterns. The gate stack structure 150 may include a structure in which the first material layers 111 as interlayer insulating layers and the third material layers 157 as conductive patterns are alternately stacked. The gate stack structure 150 may be penetrated by the channel structure 147A, and the channel structure 147A may extend to the inside of the cell region Ra of the first substrate 101. The memory layer 137 may extend to between the end portion of the channel structure 147A and the first substrate 101 from between the channel structure 147A and the gate stack structure 150.

Through the processes described with reference to FIGS. 12A to 12E, a memory cell array including the plurality of memory cell strings STR described with reference to FIG. 1 may be formed on the first substrate 101. Each of the memory cell strings may include a drain select transistor DST, memory cells MC, and a source select transistor SST, which are connected in series, as described with reference to FIG. 1. The drain select transistor DST, the memory cells MC, and the source select transistor SST, which are described with reference to FIG. 1, may be defined at intersection portions of the channel structure 147A shown in FIG. 12E and the third material layers 157 as conductive patterns, and be connected in series by the channel structure 147A.

Subsequently, a sidewall insulating layer 161 covering a sidewall of the gate stack structure 150 may be formed. Subsequently, a second insulating layer 163 may be formed, which fills the slit SI and extends to cover the sidewall insulating layer 161 and the first insulating layer 151.

Subsequently, a contact hole 165 may be formed, which penetrates the second insulating layer 163, the first insulating layer 151, and the dummy stack structure 110. The contact hole 165 may extend to the inside of the interconnection region Rb of the first substrate 101. In the step of forming the contact hole 165, a depth of the contact hole 165 in the first substrate 101 may be variously controlled according to an etching amount of the first substrate 101. The depth of the contact hole 165 in the first substrate 101 may be equal to that of the channel hole 115 in the first substrate 101 or be shallower or deeper than that of the channel hole 115 in the first substrate 101.

Subsequently, a vertical contact plug 167 may be formed by filling the contact hole 165 with a conductive material.

Figure 12F:
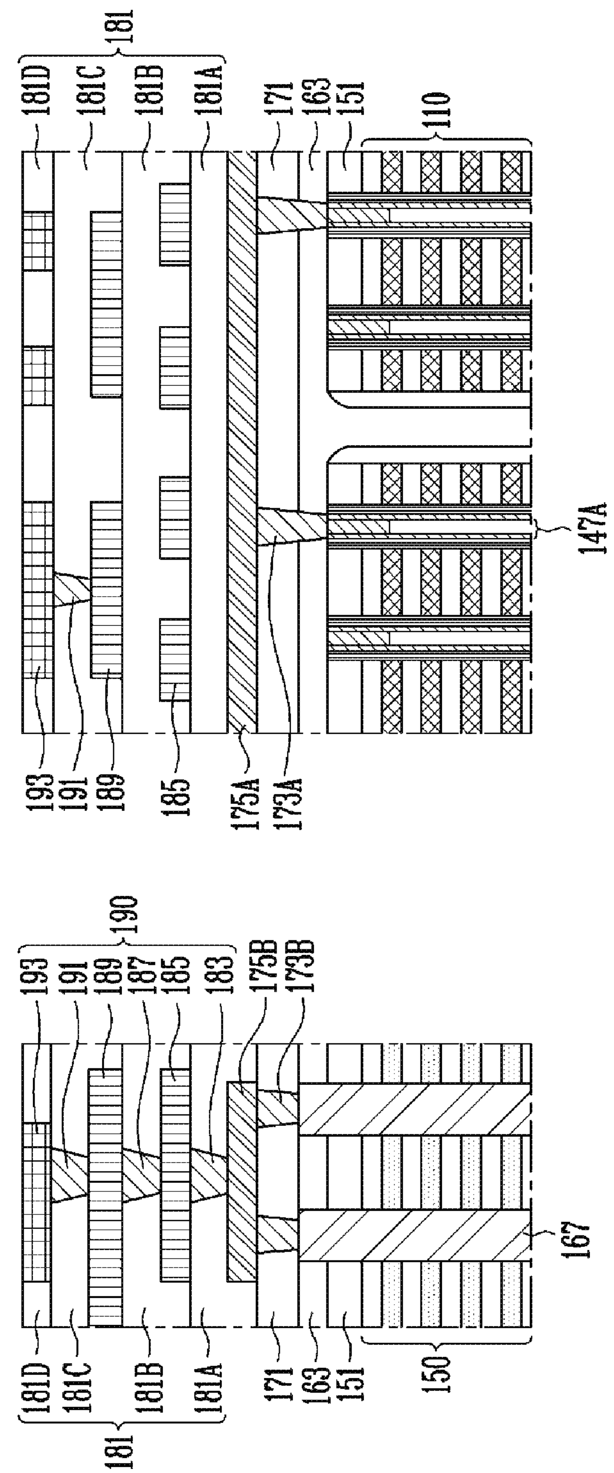

Referring to FIG. 12F, a third insulating layer 171 may be formed on the second insulating layer 163. The third insulating layer 171 may extend to cover the vertical contact plug 167. Subsequently, contact plugs 173A and 173B may be formed, which penetrate the third insulating layer 171 or penetrate the third insulating layer 171 and the second insulating layer 163.

The contact plugs 173A and 173B may include a first contact plug 173A extending to be in contact with the channel structure 147A and a second contact plug 173B extending to be in contact with the vertical contact plug 167.

Subsequently, a first line array 175A and 175B may be formed. The first line array 175A and 175B may include a bit line 175A connected to the first contact plug 173A and a connection line 175B connected to the second contact plug 173B. Subsequently, a first insulating structure 181 covering the first line array 175A and 175B may be formed.

The first insulating structure 181 may include two or more insulating layers 181A to 181D. First connection structures 190 may be embedded in the first insulating structure 181. Each of the first connection structures 190 may include a plurality of conductive patterns 183, 185, 187, 189, 191, and 193. The first insulating structure 181 and the first connection structures 190 are not limited to the examples shown in the drawing, and may be variously modified.

Some of the first connection structures 190 may be connected to the vertical contact plug 167. Other some of the first connection structures 190 may be connected to the memory cell array. The conductive patterns 183, 185, 187, 189, 191, and 193 included in each of the first connection structures 190 may include a first bonding metal 193 having a surface exposed to the outside of the first insulating structure 181.

Figure 13:
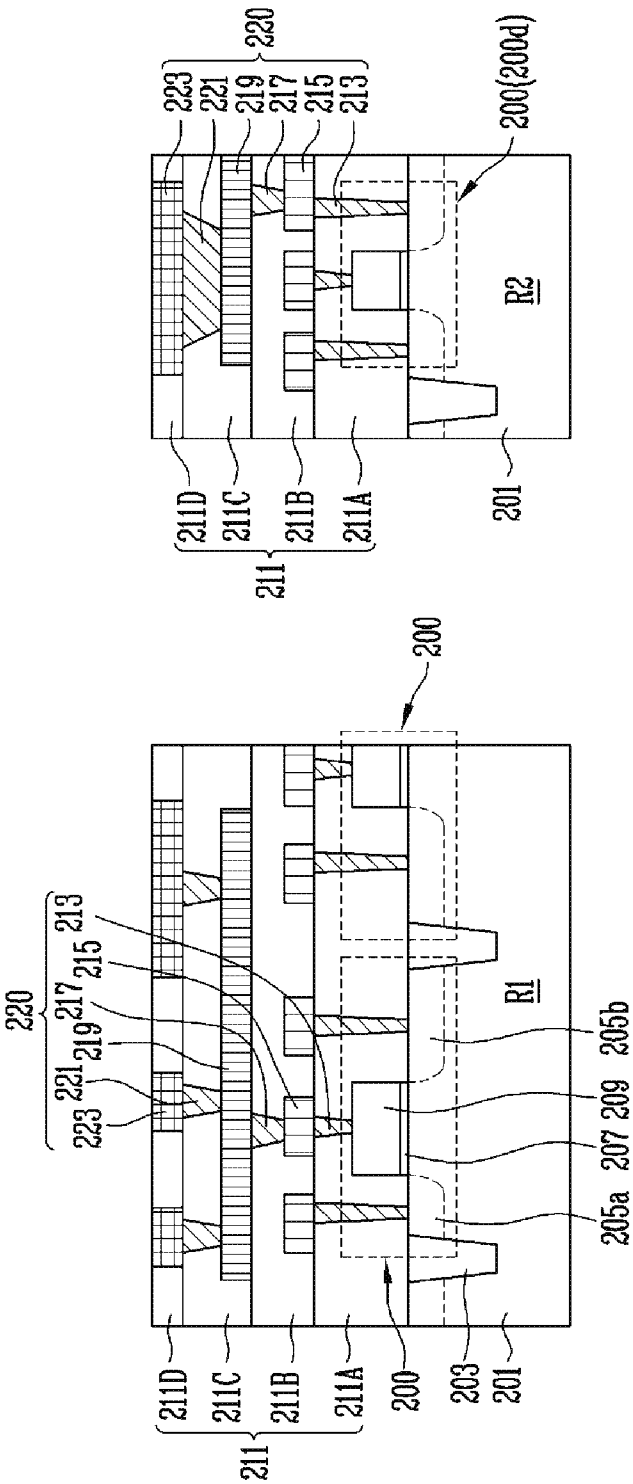

FIG. 13 is a sectional view illustrating an embodiment of the step S2A shown in FIG. 11.

Referring to FIG. 13, the step S2A may include a step of forming a plurality of transistors 200 constituting a Complementary Metal Oxide Semiconductor (CMOS) circuit on a second substrate 201 including a first region R1 and a second region R2. In an embodiment, the CMOS circuit may include two or more transistors 200.

The second substrate 201 may be a bulk silicon substrate, a silicon on insulator substrate, a germanium substrate, a germanium on insulator substrate, a silicon-germanium substrate, or an epitaxial film formed through a selective epitaxial growth process.

Each of the transistors 200 may be formed on active regions of the second substrate 201, which are divided by isolation layers 203. Each of the transistors 200 may include a gate insulating layer 207 and a gate electrode 209, which are stacked on an active region corresponding thereto, and junctions 205*a* and 205*b* formed in active regions at both sides of the gate electrode 209. The junctions 205*a* and 205*b* may include a conductivity type dopant for implementing a transistor corresponding thereto. The junctions 205*a* and 205*b* may include any one of an n-type dopant and a p-type dopant.

The step S2A may include a step of forming second connection structures 220 connected to the transistors 200 constituting the CMOS circuit and second insulating structures 211 covering the second connection structures 220 and the transistors 200.

The second insulating structure 211 may include two or more insulating layers 211A to 211D. The second connection structures 220 may be embedded in the second insulating structure 211. Each of the second connection structures 220 may include a plurality of conductive patterns 213, 215, 217, 219, 221, and 223. The second insulating structure 211 and the second connection structures 220 are not limited to the examples shown in the drawing, and may be variously modified.

Some of the second connection structures 220 may be connected to a discharge transistor 200*d* among the transistors 200. The conductive patterns 213, 215, 217, 219, 221, and 223 included in each of the second connection structures 220 may include a second bonding metal 223 having a surface exposed to the outside of the second insulating structure 211.

Figure 14:
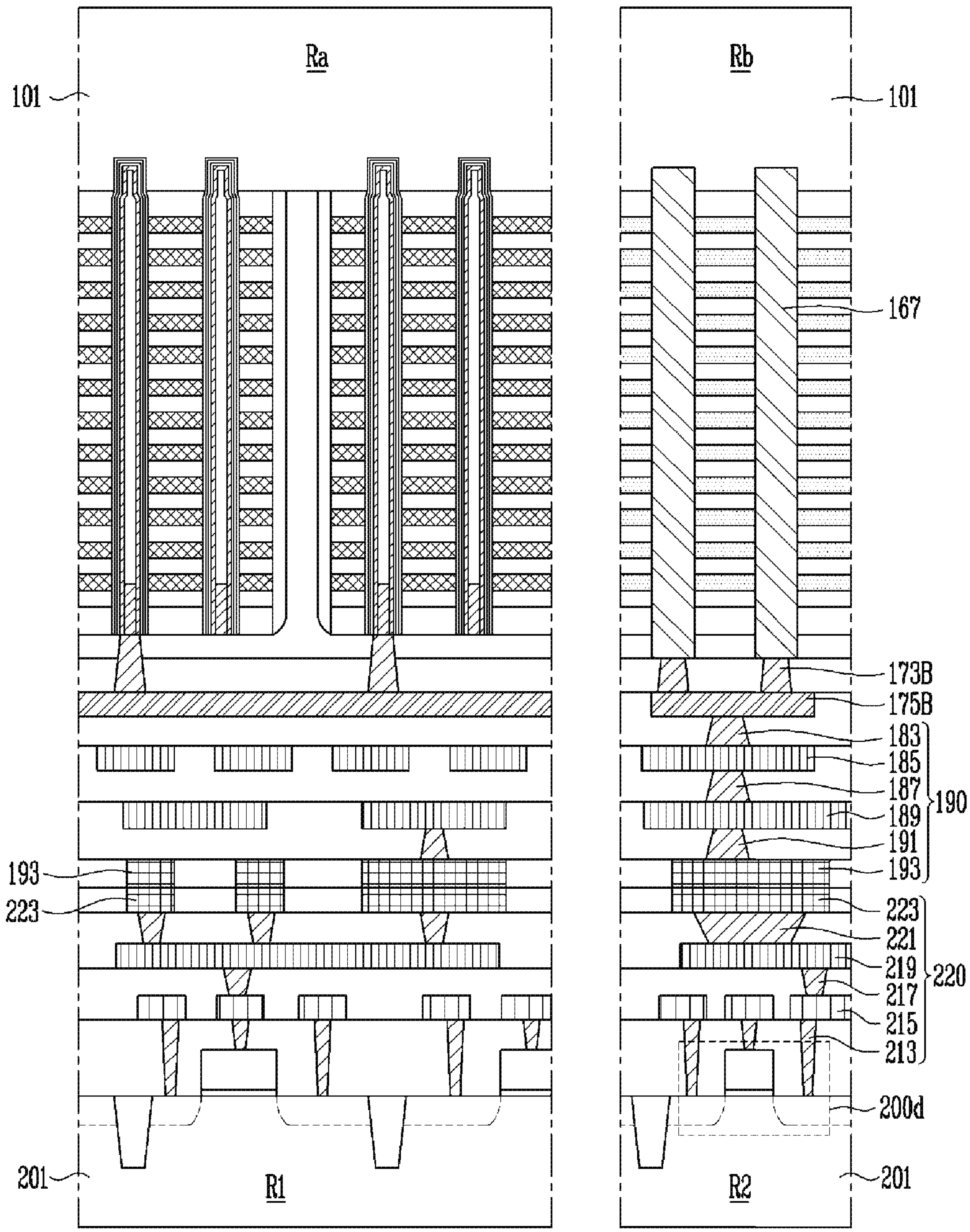

FIG. 14 is a sectional view illustrating an embodiment of the step S3 shown in FIG. 11.

Referring to FIG. 14, the step S3 may include a step of aligning the first substrate 101 and the second substrate 201 such that the first bonding metal 193 on the substrate 101 and the second bonding metal 223 on the second substrate 201 are in contact with each other. The first substrate 101 and the second substrate 201 may be aligned such that the cell region Ra of the first substrate 101 overlaps with the first region R1 of the second substrate 201 and the interconnection region Rb of the first substrate 101 overlaps with the second region R2 of the second substrate 201. The first bonding metal 193 and the second bonding metal 223 may include various metals. For example, the first bonding metal 193 and the second bonding metal 223 may include copper.

The step S3 may include a step of allowing the first bonding metal 193 and the second bonding metal 223 to be adhered to each other. To this end, after heat is applied to the first bonding metal 193 and the second bonding metal 223, the first bonding metal 193 and the second bonding metal 223 may be cured. However, the present disclosure is not limited thereto, and various processes for connecting the first bonding metal 193 and the second bonding metal 223 may be introduced.

Through the above-described processes, the vertical contact plug 167 may be connected to the discharge transistor 200*d* via the second contact plug 173B, the connection line 175B, the first connection structure 190, and the second connection structure 220.

Figure 15:
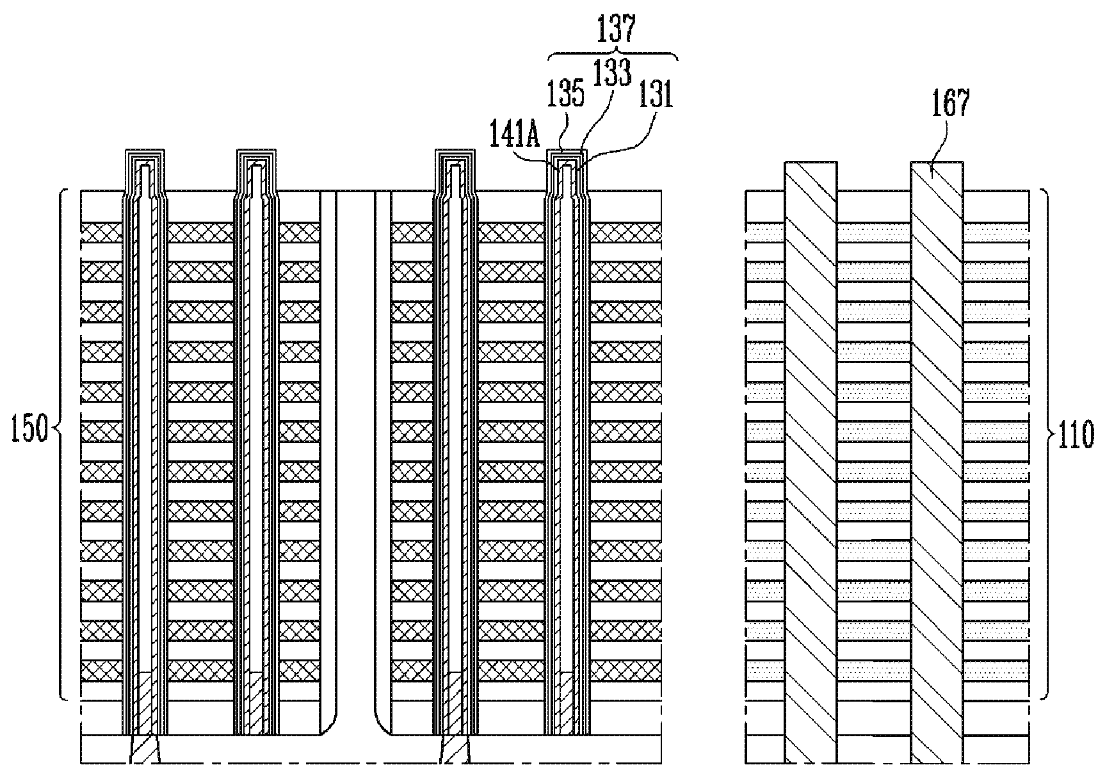

FIG. 15 is a sectional view illustrating an embodiment of the step S5 shown in FIG. 11.

Referring to FIG. 15, the first substrate 101 shown in FIG. 14 may be removed. When the first substrate 101 is removed, the memory layer 137 may serve as an etch stop layer. Accordingly, the channel layer 141A farther protruding than the gate stack structure 150 can be protected by the memory layer 137. When the first substrate 101 is removed, an end portion of the vertical contact plug 167 penetrating the dummy stack structure 110 may be exposed.

Figure 16:
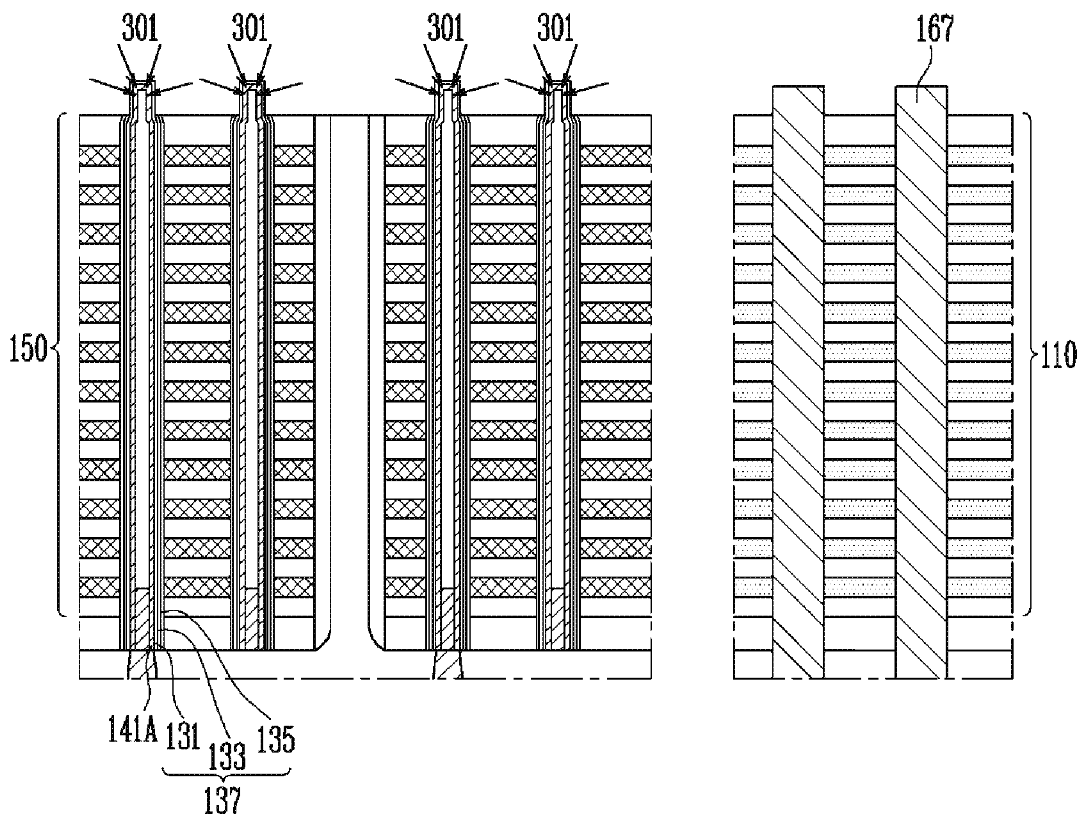

FIG. 16 is a sectional view illustrating an embodiment of the step S7 shown in FIG. 11.

Referring to FIG. 16, conductivity type dopants 301 may be injected into an end portion of the channel layer 141A farther protruding than the gate stack structure 150. The conductivity type dopants 301 may include an n-type dopant for junctions. The conductivity type dopants 301 may include a p-type dopant for counter-doping.

The conductivity type dopants 301 may be injected in a state in which the end portion of the channel layer 141A is covered by at least one of the blocking insulating layer 135, the data storage layer 133, and the tunnel insulating layer 131. In an embodiment, before the conductivity type dopants 301 is injected, the tunnel insulating layer 131 may be exposed by removing a portion of the blocking insulating layer 135 and a portion of the data storage layer 133, which cover the end portion of the channel layer 141A. Subsequently, the conductivity type dopants 301 may be injected in a state in which the end portion of the channel layer 141A is covered by the tunnel insulating layer 131.

Figure 17:
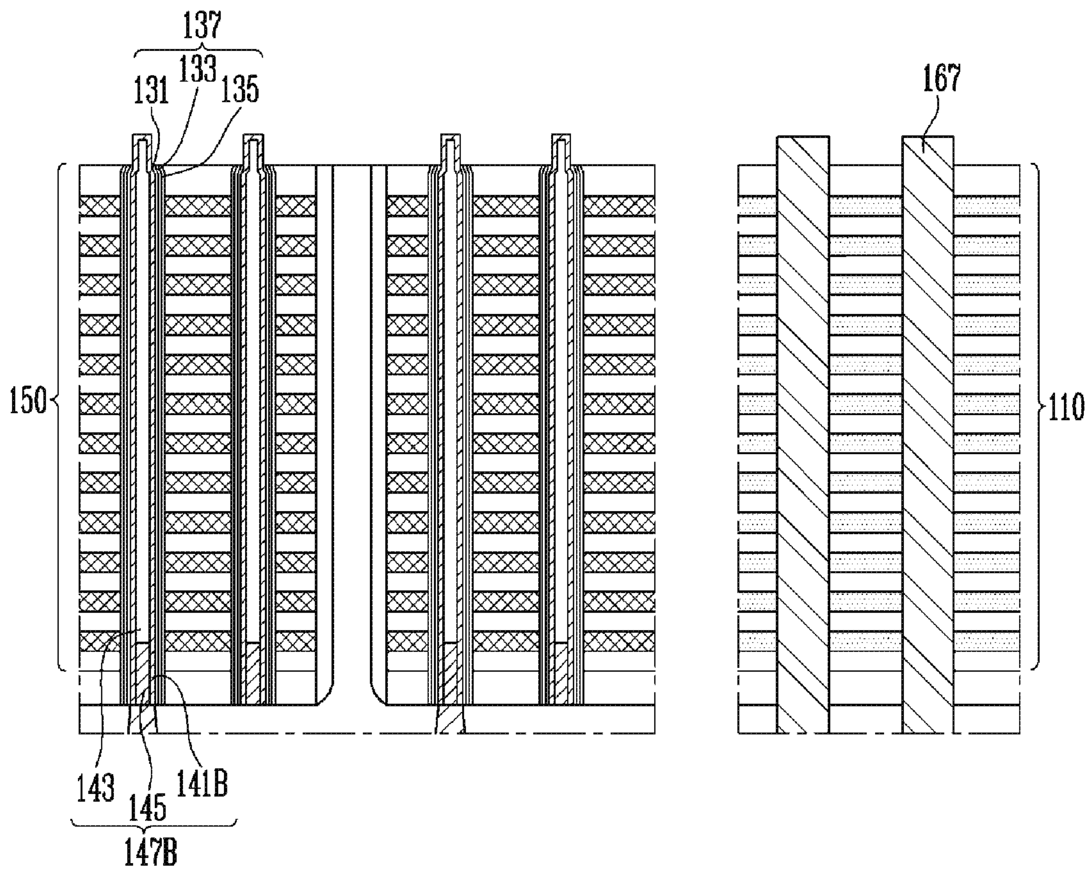

FIG. 17 is a sectional view illustrating an embodiment of the step S7 shown in FIG. 11.

Hereinafter, a reference numeral designating a channel layer including the conductivity type dopants 301 described with reference to FIG. 16 is defined as "141B," and a reference numeral designating a channel structure including the conductivity type dopants 301 is defined as "147B."

Referring to FIG. 17, a portion of the tunnel insulating layer 131 farther protruding than the gate stack structure 150. Accordingly, an end portion of the channel structure 147B and an end portion of the channel layer 141B, which farther protrude than the gate stack structure 150, may be exposed.

Figure 18A:
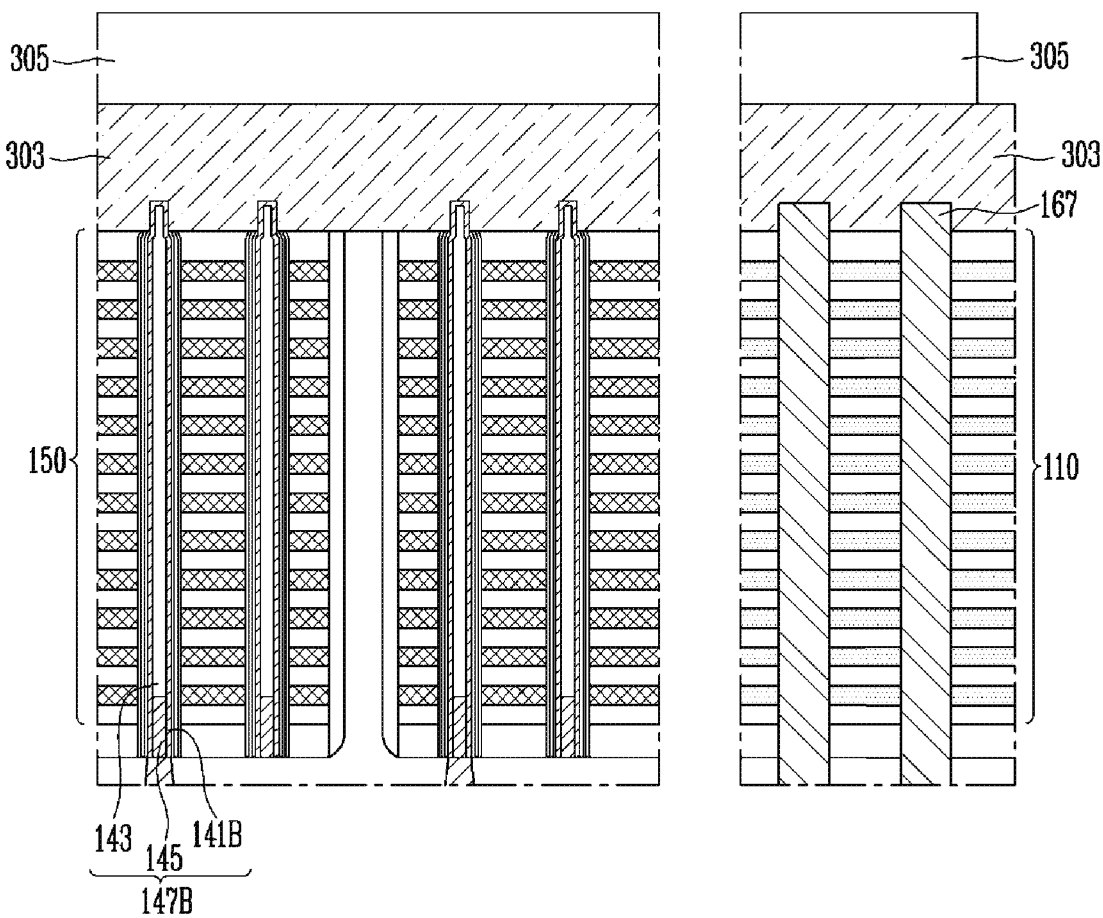
Figure 18B:
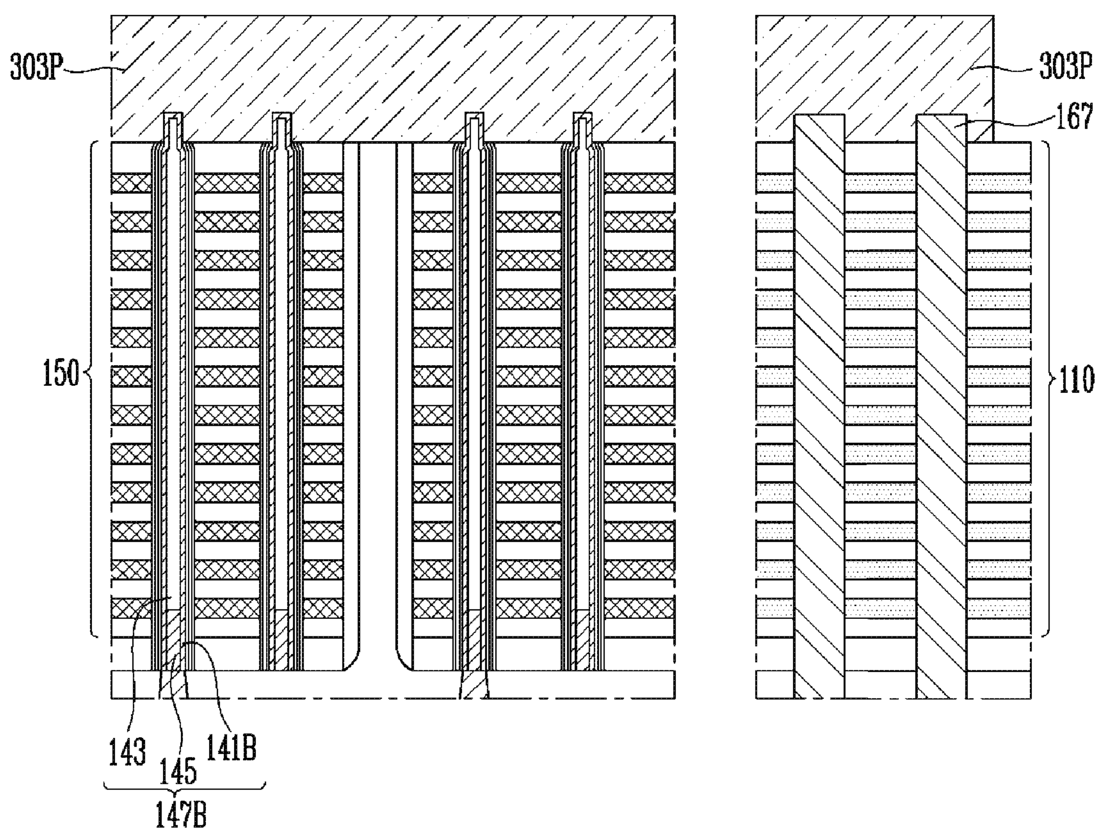
Figure 18C:
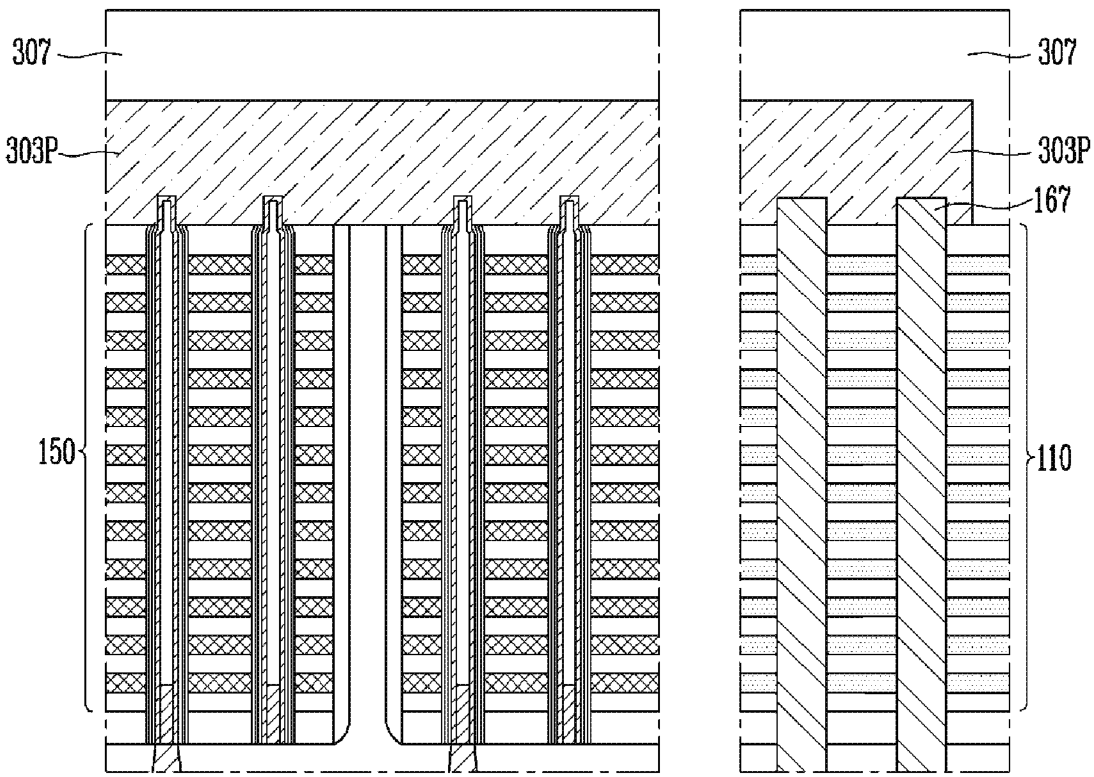

FIGS. 18A to 18C are sectional views illustrating an embodiment of the step S11 shown in FIG. 11.

Referring to FIG. 18A, the step S11 may include a step of forming a conductive layer 303 to be in contact with the exposed end portion of the channel structure 147B and a step of forming a second mask pattern 305 on the conductive layer 303. A layout of the common source line may be defined by the second mask pattern 305.

In an embodiment, the conductive layer 303 may include a metal for the common source line CSL shown in each of FIGS. 2, 4, 5, and 6, the common source line CSLb shown in FIG. 7, and a common source line CSLc shown in FIG. 8.

In another embodiment, the conductive layer 303 may include the source-side doped semiconductor layer SE described with reference to FIGS. 9 and 10 and a metal layer MT disposed on a surface of the source-side doped semiconductor layer SE.

Referring to FIG. 18B, the conductive layer 303 shown in FIG. 18A may be etched through an etching process using the second mask pattern 305 described with reference to FIG. 18A as an etch barrier. Accordingly, a common source line 303P is formed, which covers the end portion of the channel structure 141B farther protruding than the gate stack structure 150 and extends to be in contact with the vertical contact plug 167. The common source line 303P may overlap with the gate stack structure 150 and the dummy stack structure 110.

Referring to FIG. 18C, a protective insulating layer 307 covering the common source line 303P may be formed.

Figure 19:
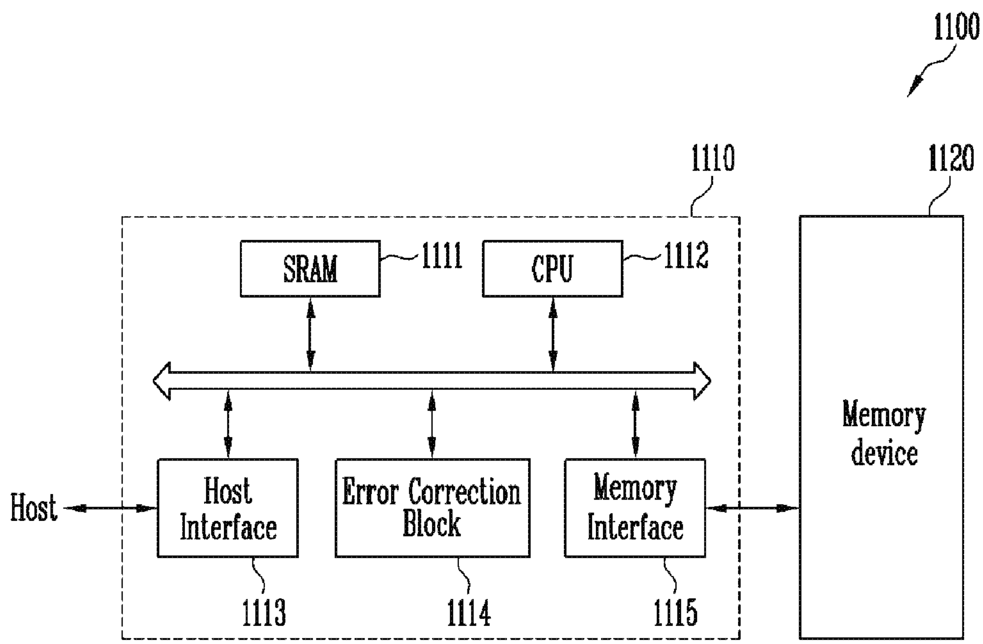
FIG. 19 is a block diagram illustrating a configuration of a memory system in accordance with an embodiment of the present disclosure.

FIG. 19 is a block diagram illustrating a configuration of a memory system 1100 in accordance with an embodiment of the present disclosure.

Referring to FIG. 19, the memory system 1100 in accordance with the embodiment of the present disclosure includes a memory device 1120 and a memory controller 1110.

The memory device 1120 may be a multi-chip package configured with a plurality of flash memory chips. The memory device 1120 may include at least one of the semiconductor memory devices described with reference to FIGS. 1 to 10. For example, the memory device 1120 may include a channel structure farther protruding toward a common source line than a gate stack structure.

The memory controller 1110 is configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 20:
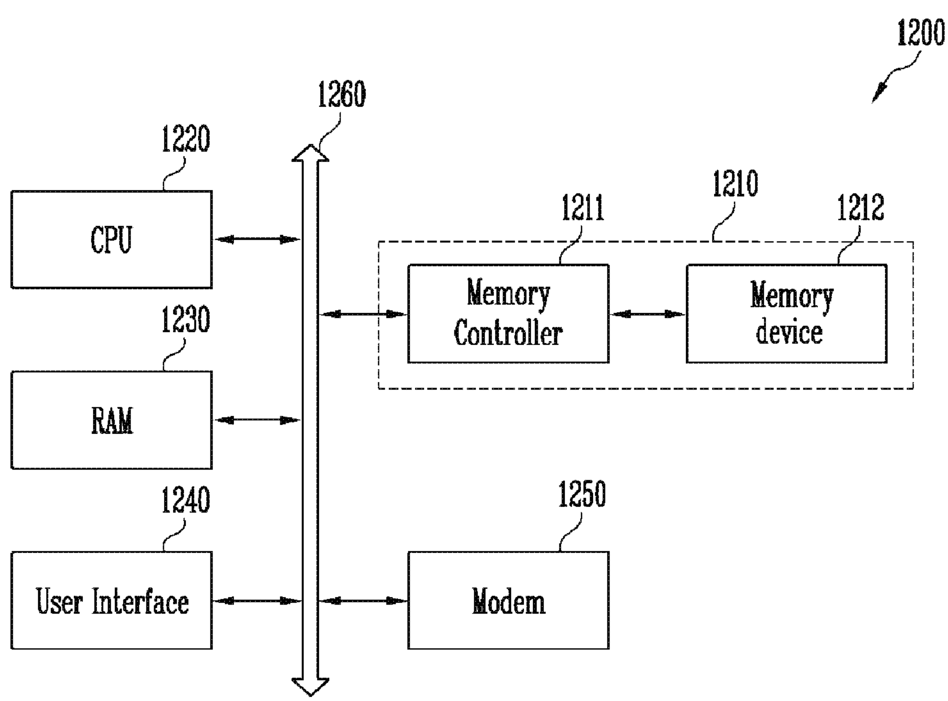
FIG. 20 is a block diagram illustrating a configuration of a computing system in accordance with an embodiment of the present disclosure.

FIG. 20 is a block diagram illustrating a configuration of a computing system 1200 in accordance with an embodiment of the present disclosure.

Referring to FIG. 20, the computing system 1200 in accordance with an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

In accordance with the present disclosure, a substrate is removed, so that a channel structure can be exposed. Further, a connection structure between the channel structure and a common source line can be made.

In accordance with the present disclosure, a defect occurring in a process of connecting the channel structure and the common source line can be prevented, and it can be checked whether the channel structure and the common source line are connected to each other.

What is claimed is:

1. A semiconductor memory device comprising:

a substrate having a Complementary Metal Oxide Semiconductor (CMOS) circuit;

a gate stack structure including interlayer insulating layers and conductive patterns, which are alternately stacked in a vertical direction on the substrate;

a channel structure having a first part penetrating the gate stack structure and a second part extending from one end of the first part, the second part extending beyond the gate stack structure;

a common source line extending to overlap with the gate stack structure, the common source line surrounding the second part of the channel structure;

a memory layer disposed between the first part of the channel structure and the gate stack structure; and a bit line connected to an opposite end of the first part of the channel structure which is opposite to the one end of the first part, the bit line being disposed between the substrate and the gate stack structure, wherein the second part of the channel structure includes a dopant of a first conductivity type and a dopant of a second conductivity type different from the first conductivity type, and wherein the dopants of the first and second conductivity types are injected into substantially a same portion of the second part of the channel structure, and the dopants of the second conductivity type are a counter-doping to the dopants of the first conductivity type.

2. The semiconductor memory device of claim 1, wherein a diameter of the first part of the channel structure is greater than that of the second part of the channel structure.

3. The semiconductor memory device of claim 1, wherein a sidewall of the first part of the channel structure and a sidewall of the second part of the channel structure are aligned with each other to form a straight line.

4. The semiconductor memory device of claim 1, wherein the second part of the channel structure has a convex shape which extends from the first part of the channel structure and into a concave portion of the common source line.

5. The semiconductor memory device of claim 1, wherein the common source line includes a metal.

6. The semiconductor memory device of claim 1, wherein the common source line includes:

a doped semiconductor layer in direct contact with the second part of the channel structure; and a metal layer disposed on a surface of the doped semiconductor layer, the metal layer being connected to the channel structure via the doped semiconductor layer.

7. The semiconductor memory device of claim 1, wherein the channel structure includes:

a core insulating layer disposed in a central region of the channel structure;

a doped semiconductor layer disposed in the central region of the channel structure, the doped semiconductor layer being disposed between the core insulating layer and the bit line; and a channel layer extending between the core insulating layer and the memory layer and between the common source line and the core insulating layer from between the doped semiconductor layer and the memory layer.

8. The semiconductor memory device of claim 7, wherein a portion of the channel layer that extends to the inside of the common source line constitutes the second part of the channel structure.

9. The semiconductor memory device of claim 7, wherein the dopant of the first conductivity type and the dopant of the second conductivity type are included in a portion of the channel layer, which is adjacent to the common source line.

10. The semiconductor memory device of claim 1, wherein the memory layer is formed shorter than the channel structure in the vertical direction.

11. The semiconductor memory device of claim 1, further comprising:

a dummy stack structure disposed at a level substantially equal to a level of the gate stack structure;

a conductive vertical contact plug penetrating the dummy stack structure; and a conductive connection line connected to the conductive vertical contact plug, the conductive connection line being disposed at a level substantially equal to a level of the bit line.

12. The semiconductor memory device of claim 11, further comprising:

an insulating structure extending between the conductive connection line and the substrate from between the substrate and the bit line; and conductive connection structures penetrating the insulating structure, the conductive connection structures connecting the conductive connection line to the CMOS circuit.

13. The semiconductor memory device of claim 11, wherein the common source line extends to be connected to the conductive vertical contact plug.

14. The semiconductor memory device of claim 1, wherein the first conductivity type is n-type and the second conductivity type is p-type.

15. The semiconductor memory device of claim 1, wherein the channel structure has an inflection point at a boundary between the first part and the second part.

16. The semiconductor memory device of claim 15, wherein the inflection point of the channel structure is adjacent to a boundary between the memory layer and the common source line.

17. A semiconductor memory device comprising:

a substrate having a Complementary Metal Oxide Semiconductor (CMOS) circuit;

a gate stack structure including interlayer insulating layers and conductive patterns, which are alternately stacked in a vertical direction on the substrate;

a channel structure having a first part penetrating the gate stack structure and a second part extending from one end of the first part, the second part extending beyond the gate stack structure;

a common source line extending to overlap with the gate stack structure, the common source line surrounding the second part of the channel structure;

a memory layer disposed between the first part of the channel structure and the gate stack structure; and a bit line connected to an opposite end of the first part of the channel structure which is opposite to the one end of the first part, the bit line being disposed between the substrate and the gate stack structure, wherein the common source line includes a metal layer and a barrier layer between the metal layer and the channel structure, wherein the channel structure is adjacent to the barrier layer of the common source line without intervening a doped semiconductor layer, and wherein a dopant of a first conductivity type and a dopant of a second conductivity type different from the first conductivity type are injected into substantially a same portion of the channel structure adjacent to the common source line, and the dopant of the second conductivity type is a counter-doping to the dopant of the first conductivity type.

18. A semiconductor memory device comprising:

a substrate having a Complementary Metal Oxide Semiconductor (CMOS) circuit;

a gate stack structure including interlayer insulating layers and conductive patterns, which are alternately stacked in a vertical direction on the substrate;

a channel structure having a first part penetrating the gate stack structure and a second part extending from one end of the first part, the second part extending beyond the gate stack structure;

a common source line extending to overlap with the gate stack structure, the common source line surrounding the second part of the channel structure;

a memory layer disposed between the first part of the channel structure and the gate stack structure; and a bit line connected to an opposite end of the first part of the channel structure which is opposite to the one end of the first part, the bit line being disposed between the substrate and the gate stack structure, wherein an outer diameter of the second part of the channel structure defined along an interface between the channel structure and the common source line is greater than an outer diameter of the first part of the channel structure defined along an interface between the channel structure and the memory layer.

* * * * *